United States Patent
Sugai et al.

(10) Patent No.: US 8,136,479 B2
(45) Date of Patent: Mar. 20, 2012

(54) PLASMA TREATMENT APPARATUS AND PLASMA TREATMENT METHOD

(75) Inventors: Hideo Sugai, Nagoya (JP); Tetsuya Ide, Yokohama (JP); Atsushi Sasaki, Yokohama (JP); Kazufumi Azuma, Yokohama (JP); Yukihiko Nakata, Yokohama (JP)

(73) Assignee: Sharp Kabushiki Kaisha, Osaka (JP)

( * ) Notice: Subject to any disclaimer, the term of this patent is extended or adjusted under 35 U.S.C. 154(b) by 494 days.

(21) Appl. No.: 11/081,528

(22) Filed: Mar. 17, 2005

(65) Prior Publication Data
US 2005/0205016 A1    Sep. 22, 2005

(30) Foreign Application Priority Data
Mar. 19, 2004  (JP) ................. 2004-081308
Mar. 19, 2004  (JP) ................. 2004-081309

(51) Int. Cl.
C23C 16/511  (2006.01)
C23F 1/00    (2006.01)
H01L 21/306  (2006.01)
C23C 16/06   (2006.01)
C23C 16/22   (2006.01)

(52) U.S. Cl. ...... 118/723 MW; 156/345.36; 156/345.41

(58) Field of Classification Search .......... 118/723 MA, 118/723 MW; 156/345.36, 345.41
See application file for complete search history.

(56) References Cited

U.S. PATENT DOCUMENTS

| | | | | |
|---|---|---|---|---|
| 5,234,526 A | * | 8/1993 | Chen et al. ............... | 156/345.42 |
| 5,342,472 A | * | 8/1994 | Imahashi et al. ......... | 156/345.42 |
| 5,359,177 A | * | 10/1994 | Taki et al. ................ | 219/121.43 |
| 5,415,719 A | * | 5/1995 | Akimoto .................. | 156/345.38 |
| 5,433,789 A | * | 7/1995 | Kakehi et al. ........... | 118/723 MW |
| 5,545,258 A | * | 8/1996 | Katayama et al. ..... | 118/723 MP |
| 5,639,309 A | * | 6/1997 | Akimoto ................. | 118/723 MP |
| 5,698,036 A | * | 12/1997 | Ishii et al. ............. | 118/723 MW |
| 5,874,706 A | * | 2/1999 | Ishii et al. ................ | 219/121.43 |
| 5,955,382 A | * | 9/1999 | Yamauchi et al. ........... | 438/726 |
| 5,988,104 A | * | 11/1999 | Nambu ................. | 118/723 MW |
| 6,076,484 A | * | 6/2000 | Matsumoto et al. .. | 118/723 MW |
| 6,198,224 B1 | * | 3/2001 | Spitzl et al. ............. | 315/111.21 |
| 6,222,170 B1 | * | 4/2001 | Tucker et al. .................. | 219/748 |
| 6,527,909 B2 | * | 3/2003 | Ishii et al. ................ | 156/345.41 |
| 6,652,709 B1 | * | 11/2003 | Suzuki et al. ............ | 156/345.41 |
| 6,695,948 B2 | * | 2/2004 | Ishii et al. ................ | 156/345.41 |
| 6,713,968 B2 | * | 3/2004 | Ishii et al. ................ | 315/111.21 |
| 6,744,802 B1 | * | 6/2004 | Ohmi et al. ..................... | 372/82 |

(Continued)

FOREIGN PATENT DOCUMENTS

JP          2722070          11/1997

(Continued)

OTHER PUBLICATIONS

U.S. Appl. No. 11/969,500, filed Jan. 4, 2008, Sugai, et al.

(Continued)

*Primary Examiner* — Rudy Zervigon
(74) *Attorney, Agent, or Firm* — Birch, Stewart, Kolasch & Birch, LLP

(57) ABSTRACT

A plasma treatment apparatus generates a plasma in a treatment vessel by an electromagnetic wave radiated from an electromagnetic wave radiation portion into the treatment vessel to perform plasma treatment by the plasma. At least a part of a wall constituting the treatment vessel includes at least a part of an electromagnetic wave transmission path which transmits the electromagnetic wave.

11 Claims, 13 Drawing Sheets

U.S. PATENT DOCUMENTS

| | | | |
|---|---|---|---|
| 6,998,565 B2* | 2/2006 | Shinohara | 219/121.43 |
| 7,311,796 B2* | 12/2007 | Goto et al. | 156/345.36 |
| 7,582,569 B2* | 9/2009 | Ohmi et al. | 438/728 |
| 2001/0024114 A1* | 9/2001 | Kitagawa et al. | 324/71.1 |
| 2002/0038692 A1* | 4/2002 | Ishii et al. | 156/345.48 |
| 2002/0148564 A1* | 10/2002 | Ishii et al. | 156/345.41 |
| 2003/0024647 A1* | 2/2003 | Tadera et al. | 156/345.41 |
| 2004/0107910 A1* | 6/2004 | Nakata et al. | 118/723 MW |
| 2004/0206729 A1* | 10/2004 | Shinohara | 219/121.43 |
| 2004/0244693 A1* | 12/2004 | Ishii et al. | 118/723 MW |
| 2005/0205016 A1* | 9/2005 | Sugai et al. | 118/723 MA |
| 2007/0034157 A1* | 2/2007 | Nakata et al. | 118/723 MW |
| 2008/0099447 A1* | 5/2008 | Ando et al. | 219/121.43 |

FOREIGN PATENT DOCUMENTS

| | | |
|---|---|---|
| JP | 2857090 | 11/1998 |
| JP | 11-40397 | 2/1999 |
| JP | 2001-49442 | 2/2001 |
| JP | 2002-280196 | 9/2002 |
| JP | 2004-200390 | 7/2004 |
| TW | 476811 B | 2/2002 |

OTHER PUBLICATIONS

Taiwanese Office Action issued on Jun. 7, 2011 in Taiwanese Patent Application No. 094108265.

* cited by examiner

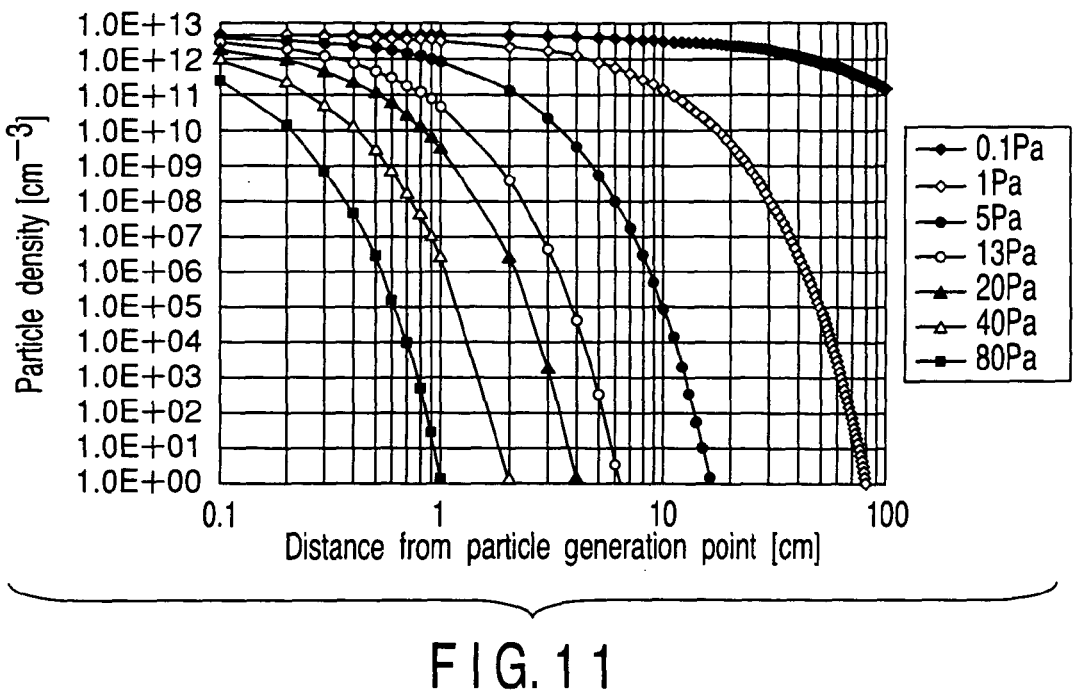
F I G. 1 1
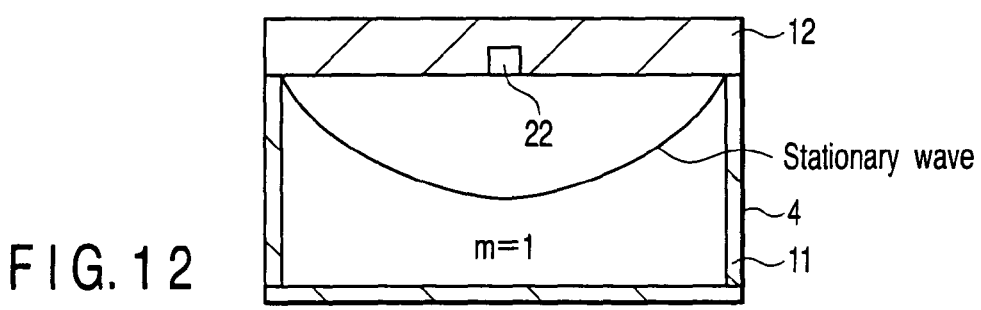
F I G. 1 2
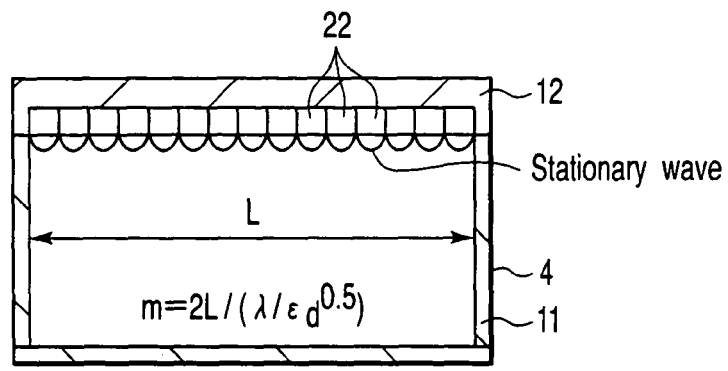
F I G. 1 3

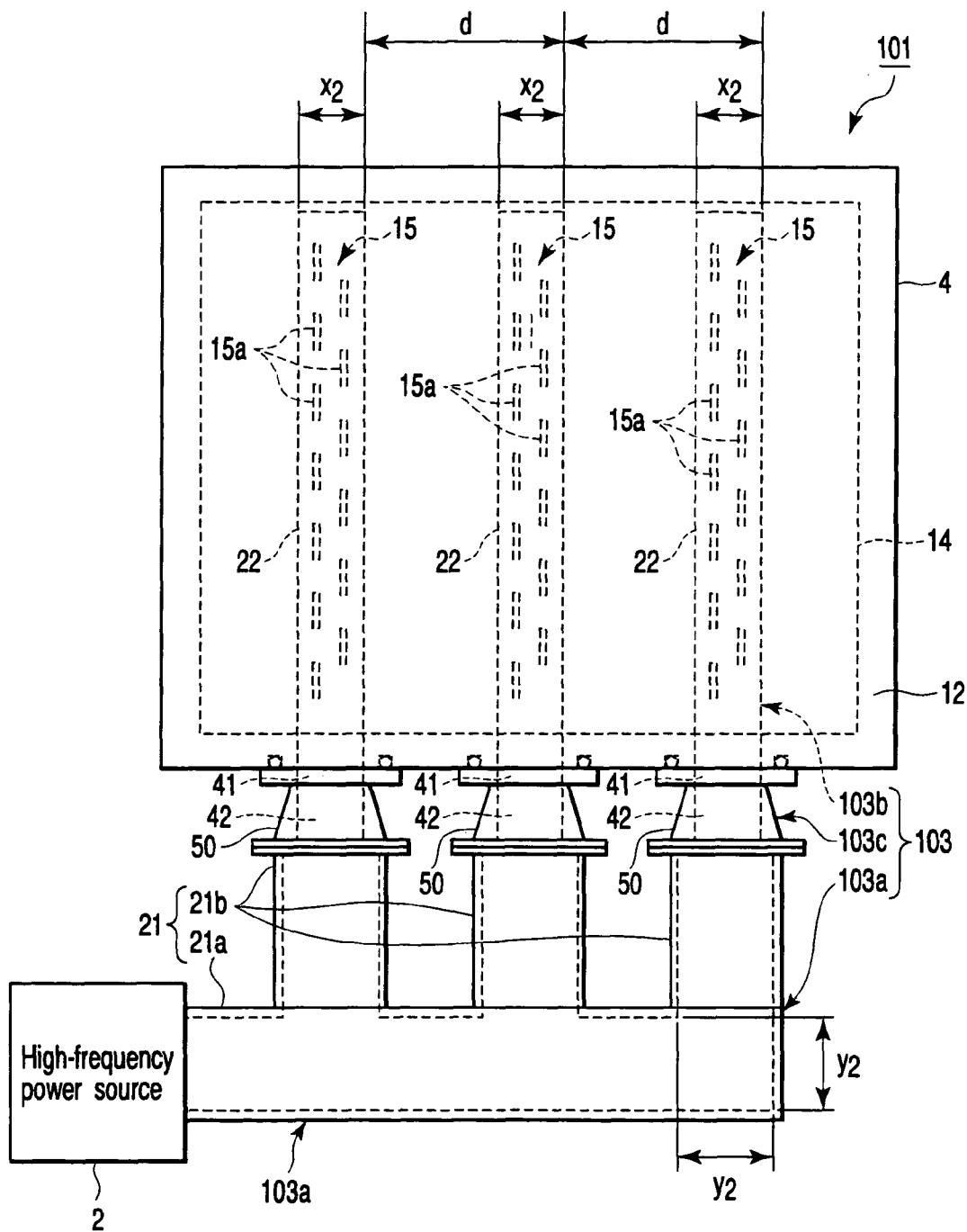
F I G. 14

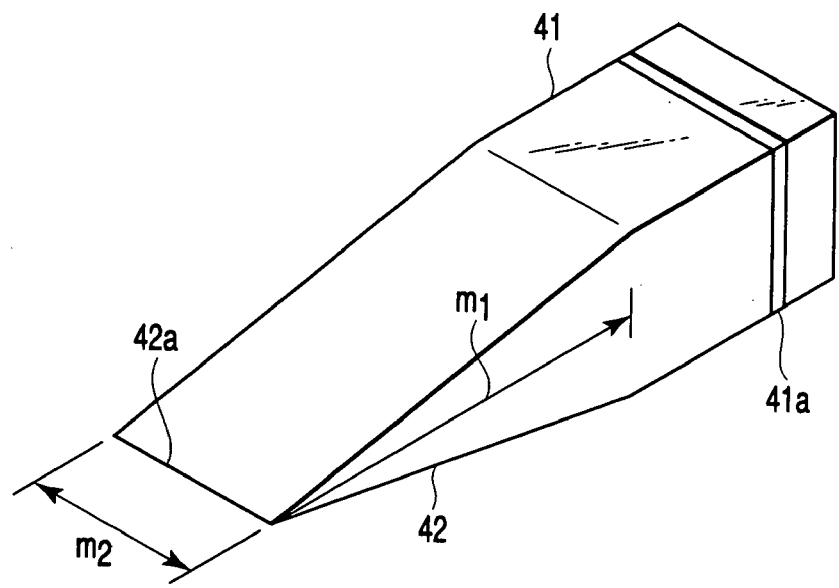
F I G. 1 8
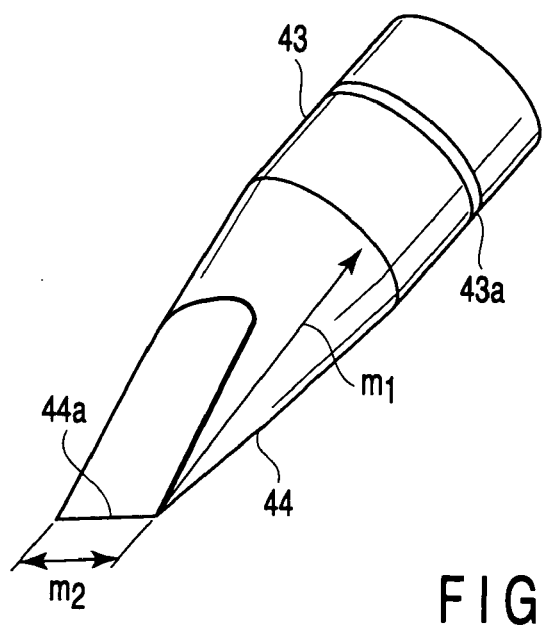
F I G. 1 9

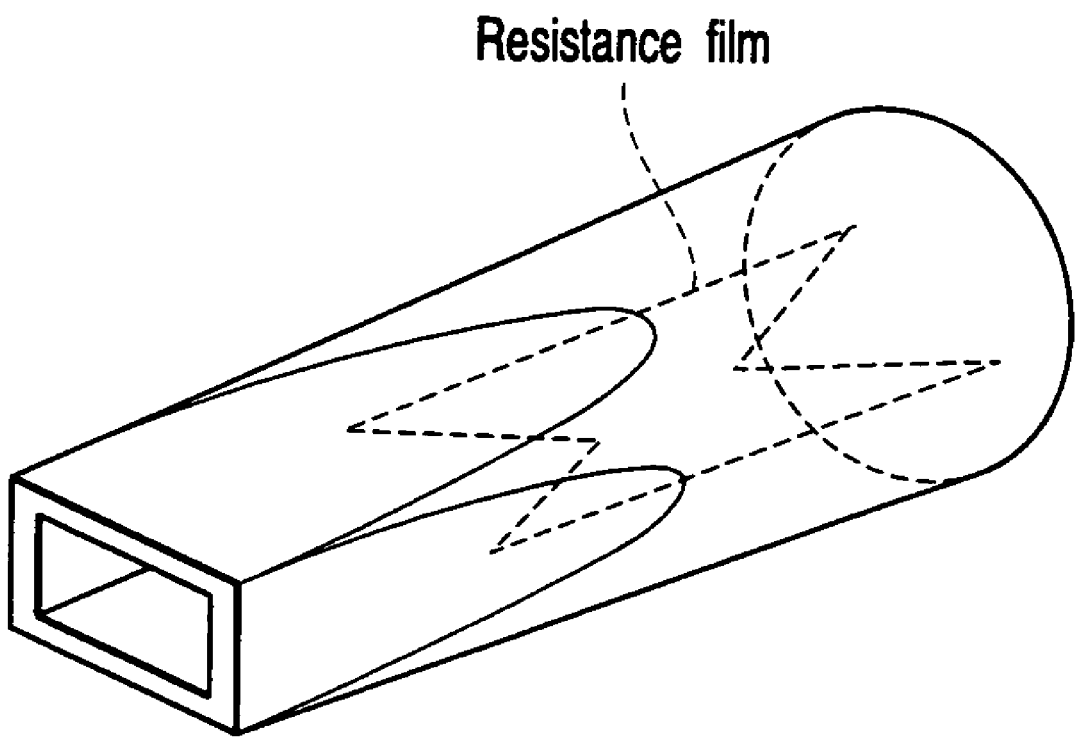
F I G. 20

PLASMA TREATMENT APPARATUS AND PLASMA TREATMENT METHOD

CROSS-REFERENCE TO RELATED APPLICATIONS

This application is based upon and claims the benefit of priority from prior Japanese Patent Applications No. 2004-081308, filed Mar. 19, 2004; and No. 2004-081309, filed Mar. 19, 2004, the entire contents of both of which are incorporated herein by reference.

BACKGROUND OF THE INVENTION

1. Field of the Invention

The present invention relates to a plasma treatment apparatus and a plasma treatment method applied to a manufacturing process or the like of semiconductor elements such as a thin film transistor (TFT) and a metal oxide semiconductor element (MOS element), semiconductor devices such as a semiconductor integrated circuit device, or display devices such as a liquid crystal display device.

2. Description of the Related Art

A parallel plate type high-frequency plasma treatment apparatus, an electron cyclotron resonance (ECR) plasma treatment apparatus and the like have heretofore been used for performing plasma treatment such as film deposition, surface reforming and etching in a manufacturing process of a semiconductor device, liquid crystal display device or the like.

However, the parallel plate type plasma treatment apparatus has a problem that plasma density is low and electron temperature is high. Since the ECR plasma treatment apparatus requires direct-current magnetic field in plasma excitation, there has been a problem that it is difficult to treat a large area.

To solve the problem, in recent years, a plasma treatment apparatus has been proposed which does not require any magnetic field in the plasma excitation and which is capable of generating plasmas having high density and low electron temperature.

As this type of plasma treatment apparatus, an apparatus has been known comprising a circular microwave radiation plate having slots arranged in a concentric shape. This plasma treatment apparatus is constituted in such a manner that microwaves introduced from a coaxial tube toward a center of the circular microwave radiation plate propagate in a diametric direction of this circular microwave radiation plate and emanate from the slots. Accordingly, since the microwaves are introduced into a vacuum vessel via en electromagnetic wave radiation window, plasmas are generated in this vacuum vessel (see, e.g., Jpn. Pat. No. 2722070).

Moreover, as a plasma treatment apparatus, an apparatus has been known in which microwaves are supplied into a chamber from two slots constituting a waveguide antenna disposed on an H face of the rectangular waveguide via a dielectric window. In this plasma treatment apparatus, a slot width is formed to be reduced in the vicinity of a reflective face. The slot is formed into a staircase or tapered shape to narrow toward the reflective face of the waveguide (see, e.g., Jpn. Pat. No. 2857090).

Furthermore, as the plasma treatment apparatus, a surface wave plasma apparatus has been known in which a plurality of rectangular waveguides are arranged in parallel with one another at equal intervals. Coupling holes are arranged in each waveguide in such a manner that coupling coefficient is successively increased toward a tip end of the waveguide. The vacuum vessel is provided with a plurality of dielectric windows divided/formed facing the respective coupling holes (see, e.g., Jpn. Pat. Appln. KOKAI Publication No. 2002-280196).

However, as in the plasma treatment apparatus described in the Jpn. Pat. No. 2722070, when the microwaves propagate through conductors, for example, the coaxial tube and the circular microwave radiation plate, propagation loss such as copper loss is generated in these conductors. When frequency increases, or coaxial transmission distance or radiation plate area increases, the propagation loss increases. Therefore, even when the plasma treatment apparatus for a comparatively large substrate of the liquid crystal display device or the like is designed using the technique described in the Jpn. Pat. No. 2722070, decay of the microwaves increases, and it is difficult to generate the plasmas with good efficiency. Since the plasma treatment apparatus described in the Jpn. Pat. No. 2722070 is constituted to radiate the microwaves from the circular microwave radiation plate, there has been a problem that the plasmas become non-uniform in corner portions of the substrate in application to the square substrate like the liquid crystal display device.

Moreover, in a case where the microwaves that have propagated through the rectangular waveguide are radiated from two slots as in the plasma treatment apparatus described in the Jpn. Pat. No. 2857090, when many negative ions exist in the generated plasmas, there is a problem that opposite-polarity diffusion coefficient of the plasma decreases. Therefore, in the technique described in the Jpn. Pat. No. 2857090, the plasmas are generated only in the vicinity of the slots from which the microwaves are radiated. This eccentricity of the plasma becomes remarkable especially in a case where pressure of the plasma is high. Therefore, in the plasma treatment apparatus described in the Jpn. Pat. No. 2857090, it is difficult to subject the large-sized substrate to the plasma treatment using, as a raw material, a gas containing oxygen, hydrogen, chlorine and the like in which the negative ions are easily generated, and this is further difficult especially in a case where the gas pressure is high. Furthermore, since distribution of the slots constituting the waveguide antenna is localized (non-uniform) with respect to the treated face of the substrate subjected to the plasma treatment, plasma density easily becomes non-uniform.

Additionally, in the technique described in the Jpn. Pat. No. 2722070 or 2857090, the electromagnetic wave radiation window (dielectric window) needs to be designed into a thickness (strength) which bears a gas pressure difference between a substantially atmospheric pressure and a substantially/approximately vacuum pressure, that is, a force of about 1 kg/cm$^2$. In general, a process gas or the like is introduced into the vacuum vessel after once evacuating the vacuum vessel (chamber) in a case where the plasma treatment is performed. Therefore, when the plasma treatment apparatus for plasma-treating a large-sized substrate having a size of 1 m square is designed using the technique described in the Jpn. Pat. No. 2722070 or 2857090, the thickness of the electromagnetic wave transmission window formed of quartz or the like becomes very large, and this is not practical.

Furthermore, in the technique described in the Jpn. Pat. Appln. KOKAI Publication No. 2002-280196, since the waveguides are arranged at intervals, it is difficult to uniformly distribute the coupling holes facing the whole treated face of a substrate to be treated. Since seals for sealing vacuum need to be disposed as many as the coupling holes, a structure of the vacuum vessel is easily complicated. Additionally, since a processing cost of a top plate of the vacuum vessel increases, there is also a problem that an apparatus price increases.

The present applicant has proposed that a waveguide be disposed in a vacuum vessel as the plasma treatment apparatus having a simple structure and capable of satisfactorily plasma-treating even the component to be treated, for example, the square substrate or the large-area substrate (see Jpn. Pat. Appln. No. 2002-366842).

Additionally, in the Jpn. Pat. Appln. No. 2002-366842, an example has been described in which the waveguide is filled with a conductor component in order to inhibit invasion of the plasmas into the waveguide. However, when the waveguide is filled with the conductor component, and the waveguide disposed in the vacuum vessel is coupled to an oscillator for oscillating an electromagnetic wave via a waveguide disposed outside the vacuum vessel, a part of the electromagnetic waves is reflected in a boundary between the waveguide outside the vacuum vessel and that in the vacuum vessel, and transmittance of the electromagnetic wave drops. For example, in a case where the waveguide outside the vacuum vessel is filled with air (dielectric constant $\in=1$), and the waveguide in the vacuum vessel is filled with quartz (dielectric constant $\in=3.8$), when a plane wave vertically enters the boundary, the transmittance is about 80%.

The present invention has been developed based on this situation, and an object thereof is to provide a plasma treatment apparatus and a plasma treatment method capable of simplifying a structure, generating uniform plasmas having large areas, or efficiently transmitting electromagnetic waves.

BRIEF SUMMARY OF THE INVENTION

According to the present invention, there is provided a plasma treatment apparatus which generates a plasma in a treatment vessel by an electromagnetic wave radiated from an electromagnetic wave radiation portion into the treatment vessel to perform plasma treatment by the plasma, wherein a wall of the treatment vessel has at least a part of an electromagnetic wave transmission path.

In the present invention and the following inventions, the "electromagnetic wave transmission path" is a line for transmitting the electromagnetic wave with high efficiency. Examples of the electromagnetic wave transmission path include a coaxial tube, a waveguide, a cavity resonator and the like.

Since the coaxial tube has a large loss (propagation loss) as compared with the waveguide, but does not have a cutoff frequency, a transmittable frequency range is broad, and the transmission path can be miniaturized even in a case where a wavelength is large.

Since a central conductor causing the loss in the coaxial tube is not disposed in the waveguide, the loss is small, and the waveguide is suitable for the transmission of a large power. However, the cutoff frequency exists, and the transmittable frequency range is small. The shape is substantially defined by the frequency of the electromagnetic wave to be transmitted.

The cavity resonator is designed in such a manner that a standing wave stands with respect to a specific frequency, and has a function of intensifying the electromagnetic wave having the wavelength.

The "electromagnetic wave radiation portion" refers to a portion which discharges the electromagnetic magnetic wave transmitted through the electromagnetic wave transmission path to the outside of the electromagnetic wave transmission path. Examples of the electromagnetic wave radiation portion include a slot, a conductor rod, an electromagnetic horn and the like.

According to the plasma treatment apparatus of the present invention, since the wall of the treatment vessel has at least a part of the electromagnetic wave transmission path, constitutions of the treatment vessel and the plasma apparatus can be simplified. Additionally, a shape or arrangement of the electromagnetic wave transmission path is adjusted, and accordingly a stable and uniform plasma can be generated in the treatment vessel regardless of the size or shape of the treatment vessel. Therefore, even a component to be treated such as a square substrate and a large-area substrate can be satisfactorily plasma-treated. According to the plasma treatment apparatus of the present invention, a large-area uniform plasma can be generated.

A plasma treatment apparatus described in the present invention comprises an electromagnetic wave transmission path which transmits an electromagnetic wave, an electromagnetic wave radiation portion for electromagnetic wave radiation coupled to the electromagnetic wave transmission path, and a treatment vessel, so that a plasma is generated in the treatment vessel by the electromagnetic wave radiated from the electromagnetic wave radiation portion into the treatment vessel, and plasma treatment is performed by the plasma, wherein at least a part of the electromagnetic wave transmission path and a wall constituting the treatment vessel are integrated.

According to the plasma treatment apparatus of the present invention, the electromagnetic wave transmission path and the wall constituting the treatment vessel are integrated. That is, since the electromagnetic wave transmission path for introducing the electromagnetic wave can be a part of the treatment vessel, the constitutions of the treatment vessel and the plasma apparatus itself can be simplified. Additionally, a shape or arrangement of the electromagnetic wave transmission path is adjusted, and accordingly a stable and uniform plasma can be generated in the treatment vessel regardless of the size or shape of the treatment vessel. Therefore, even a component to be treated such as a square substrate and a large-area substrate can be satisfactorily plasma-treated. Consequently, the apparatus is easily designed in consideration of a flow of a process gas and the like, and degassing, cleaning and the like in the treatment vessel are also facilitated. Therefore, the component to be treated can be plasma-treated by the stable and uniform plasma. Furthermore, according to the plasma treatment apparatus of the present invention, a large-area uniform plasma can be generated.

A plasma treatment apparatus described in the present invention comprises an electromagnetic wave transmission path which transmits an electromagnetic wave, an electromagnetic wave radiation portion for electromagnetic wave radiation coupled to the electromagnetic wave transmission path, and a treatment vessel, so that a plasma is generated in the treatment vessel by the electromagnetic wave radiated from the electromagnetic wave radiation portion into the treatment vessel, and plasma treatment is performed by the plasma, wherein at least a part of a tubular wall conductor forming the electromagnetic wave transmission path serves also as a wall constituting the treatment vessel.

According to the plasma treatment apparatus of the present invention, since at least a part of the tubular wall conductor forming the electromagnetic wave transmission path serves also as the wall constituting the treatment vessel, constitutions of the treatment vessel and the plasma apparatus itself can be simplified. Additionally, a shape or arrangement of the electromagnetic wave transmission path is adjusted, and accordingly a stable and uniform plasma can be generated in the treatment vessel regardless of the size or shape of the treatment vessel. Therefore, even a component to be treated such as a square substrate and a large-area substrate can be satisfactorily plasma-treated. Consequently, the apparatus is easily designed in consideration of a flow of a process gas and the like, and degassing, cleaning and the like in the treatment vessel are also facilitated. Therefore, the component to be treated can be plasma-treated by the stable and uniform plasma. Furthermore, according to the plasma treatment apparatus of the present invention, a large-area uniform plasma can be generated.

When the plasma treatment apparatus according to the present invention is carried out, at least a part of the electromagnetic wave transmission path can be disposed, for example, in the wall of the treatment vessel. That is, for example, when a tunnel-shape space extending through the wall is disposed along the wall in the plasma treatment apparatus according to the present invention, at least a part of the electromagnetic wave transmission path can be disposed in the wall of the treatment vessel.

Additionally, considering from ease of working the wall or the like, it is preferable to adopt the treatment vessel having a treatment chamber in which the component to be treated is plasma-treated, and dispose at least a part of the electromagnetic wave transmission path in an inner face of the wall defining the treatment chamber among the walls of the treatment vessel. In this case, since at least a part of the electromagnetic wave transmission path can be defined by the inner face of the wall of the treatment vessel, a part of the electromagnetic wave transmission path can be disposed in the wall of the treatment vessel more easily than in a case where a part of the electromagnetic wave transmission path is disposed to extend through the wall of the treatment vessel.

Moreover, in a case where at least a part of the electromagnetic wave transmission path is disposed in the inner face of the wall defining the treatment chamber among the walls of the treatment vessel, a concave portion defining at least a part of the electromagnetic wave transmission path is disposed in the inner face of the wall, a slot plate having a plurality of slots is adopted as the electromagnetic wave radiation portion, and the concave portion may be covered with this slot plate. It is to be noted that at this time a plurality of slots are disposed facing the concave portions. Accordingly, the electromagnetic wave transmission path can be disposed in a space surrounded with the wall face defining the concave portion and the slot plate. Additionally, the electromagnetic wave transmitted by the electromagnetic wave transmission path can be radiated in the treatment chamber via the slots.

Moreover, in a constitution in which the concave portion defining at least a part of the electromagnetic wave transmission path is disposed in the inner face of the wall, and the concave portion is covered with the slot plate from the side of the treatment chamber, the electromagnetic wave transmission path is disposed in the same closed space as that of the treatment chamber. Therefore, the electromagnetic wave can be applied into the treatment chamber without disposing any electromagnetic wave transmission window formed of quartz or the like in the treatment vessel.

That is, by the above-described constitution, the electromagnetic wave transmission window formed of quartz or the like does not have to be disposed in the treatment chamber, and therefore all sealing mechanisms in the electromagnetic wave transmission window or between the electromagnetic wave transmission window and the treatment vessel wall can be omitted. Therefore, the constitutions of the treatment vessel and the plasma apparatus itself can further be simplified.

Additionally, since the electromagnetic wave transmission window itself can be omitted, needless to say, strength (thickness of the quartz window) of the electromagnetic wave transmission window does not have to be considered. Therefore, the plasma treatment apparatus comprising a large-sized treatment vessel for the component to be treated having a large area can be easily designed. Additionally, there is not any cost rise accompanying the enlargement of the electromagnetic wave transmission window. Furthermore, since influence of the electromagnetic wave transmission window on propagation of the electromagnetic wave can be eliminated, the apparatus capable of uniformly radiating the electromagnetic wave in the treatment vessel can be easily designed. Therefore, a plasma treatment apparatus capable of plasma-treating even the component to be treated like the large-area substrate by the stable and uniform plasma.

In the constitution in which the concave portion defining at least a part of the electromagnetic wave transmission path is disposed in the inner face of the wall, and the concave portion is covered with the slot plate from the side of the treatment chamber, a dielectric component for the covering may be disposed in the treatment chamber to cover the slot plate. In this case, the plasma can be satisfactorily generated in the treatment chamber by the electromagnetic wave radiated from the electromagnetic wave radiation portion.

Additionally, when the dielectric component for the covering is disposed in the treatment chamber to cover the slot plate, a surface wave plasma can be generated in the treatment chamber. That is, a predetermined process gas is introduced into the treatment vessel (in the treatment chamber), and the electromagnetic wave is applied into the treatment vessel. Then, the process gas is excited to thereby generate the plasma, and electron density in the plasma in the vicinity of a region face into which the electromagnetic wave is applied (the vicinity of the slots in the treatment chamber) increases. When the electron density in the plasma in the vicinity of the region into which the electromagnetic wave is applied increases, it is difficult to allow the electromagnetic wave to propagate in the plasma, and the wave decays in the plasma. Therefore, the electromagnetic wave does not reach a region distant from the vicinity of the region into which the electromagnetic wave is applied, and therefore the region in which the process gas is excited by the electromagnetic wave is limited to the vicinity of the region into which the electromagnetic wave is applied. Accordingly, a surface wave plasma is generated.

In the plasma treatment using the surface wave plasma, the component to be treated can be inhibited from being damaged by ions. That is, in a state in which the surface wave plasma is generated, a region in which energy by the electromagnetic wave is applied and electrolytic dissociation of a compound occurs is localized in the vicinity of the region into which the electromagnetic wave is applied. Therefore, the component to be treated is disposed in a position distant from the region into which the electromagnetic wave is applied by a predetermined distance, and accordingly electron temperature in the vicinity of the treated face of the component to be treated can be kept to be low. That is, since increase of electric field of a sheath, generated in the vicinity of the treated face of the component to be treated, can be inhibited, incidence energy of the ion into the component to be treated lowers, and the component to be treated is inhibited from being damaged by the ion.

Therefore, when the dielectric component for the covering is disposed in the treatment chamber to cover the slot plate, a plasma treatment apparatus capable of inhibiting the component to be treated from being damaged can be obtained.

Moreover, as the treatment vessel, there is a vessel in which a lid is removable from a vessel main body for cleaning or maintenance in the treatment chamber. In the treatment vessel in which the vessel main body is separate from the lid in this manner, the working for forming the electromagnetic wave transmission path or the designing of the apparatus can be easily performed when disposing the electromagnetic wave transmission path in the lid rather than when disposing the electromagnetic wave transmission path in the vessel main body.

Therefore, in a case where the plasma treatment apparatus according to the present invention is carried out, as the treatment vessel having the treatment chamber, a vessel is preferably adopted comprising: a vessel main body having a bottom wall and a peripheral wall and opening in at least one direction; and a lid which closes the opening in the vessel main body, a wall defining the treatment chamber among the walls of the treatment vessel, having the bottom wall and the peripheral wall of the vessel main body, and the lid. At least a part of the electromagnetic wave transmission path is preferably disposed in the lid of the treatment vessel.

A plasma treatment apparatus described in the present invention is the plasma treatment apparatus according to the present invention, wherein a dielectric component is disposed in the electromagnetic wave transmission path, air tightness of the treatment vessel is held by the dielectric component, and the electromagnetic wave is introduced into the treatment vessel from the outside of the treatment vessel through the dielectric component.

For example, the waveguide for the electromagnetic wave radiation which is a part of the electromagnetic wave transmission path disposed in the wall of the treatment vessel is coupled to waveguide for electromagnetic wave distribution, which is disposed outside the treatment vessel and which is a part of the electromagnetic wave transmission path to transmit the electromagnetic wave to the waveguide for the electromagnetic wave radiation. In this case, a sealing mechanism needs to be disposed between the treatment vessel and a component like the waveguide for the electromagnetic wave distribution in order to keep air tightness of the treatment vessel. The plasma treatment apparatus described in the present invention is suitable for the above-described case, that is, a case where the waveguide disposed in the wall of the treatment vessel for the electromagnetic wave radiation is coupled to the waveguide disposed outside the treatment vessel for electromagnetic wave distribution to integrate the treatment vessel with the waveguide for the electromagnetic wave distribution.

Thus, the electromagnetic wave can be introduced into a part of electromagnetic wave transmission path disposed in the wall of the treatment vessel from the outside of the treatment vessel without complicating the constitutions of the treatment vessel and the plasma treatment apparatus itself and while keeping the air tightness of the treatment vessel. In general, the dielectric component is easily damaged, and is expensive. On the other hand, by the above-described constitution, an area of a region in which an atmospheric pressure is applied to the dielectric component for holding the air tightness of the treatment vessel can be set approximately to a sectional area of the waveguide. That is, by the constitution, since a load applied to the dielectric component for holding the air tightness of the treatment vessel can be comparatively reduced, the damage of the dielectric component can be inhibited. Additionally, since the dielectric component for holding the air tightness of the treatment vessel is disposed in the electromagnetic wave transmission path, invasion of the plasma generated in the treatment vessel in the electromagnetic wave transmission path can be inhibited. Furthermore, the apparatus is easily designed in consideration of the flow of the process gas or the like, and degassing, cleaning and the like in the treatment vessel are facilitated.

A plasma treatment apparatus described in the present invention is the plasma treatment apparatus described in the present invention, wherein a dielectric component is disposed in at least a part of a region of the electromagnetic wave transmission path positioned in the treatment vessel. In other words, the electromagnetic wave transmission path has the dielectric component in the electromagnetic wave transmission path, and the electromagnetic wave propagates in the dielectric component in the electromagnetic wave transmission path. Further in other words, the dielectric component itself in the electromagnetic wave transmission path constitutes a part of the electromagnetic wave transmission path.

Thus, the invasion of the plasma generated in the treatment vessel into the electromagnetic wave transmission path can be inhibited.

A plasma treatment apparatus described in the present invention is the plasma treatment apparatus described in the present invention, wherein the electromagnetic wave radiation portion is a slot plate having a plurality of slots, the slot plate is disposed in the treatment vessel, and a dielectric component for covering is disposed to cover the slot plate.

As understood from the above, when the dielectric component for the covering is disposed in the treatment chamber to cover the slot plate, the surface wave can propagate. Therefore, the plasma treatment can be performed by the surface wave plasma using the surface wave, having high density, and causing little ion damages on the component to be treated. Furthermore, even in the component to be treated, for example, the large-area substrate, the plasma treatment can be performed by the surface wave plasma which is stable and uniform and which hardly damages the component to be treated. Furthermore, since the slot is closed by the dielectric component for the covering, the generated plasma enters the electromagnetic wave transmission path via the slot, and the wall face defining the electromagnetic wave transmission path is not damaged. Additionally, projected power of the electromagnetic wave can be supplied into the treatment vessel with high efficiency.

Moreover, when a part of the electromagnetic wave transmission path disposed in the wall of the treatment vessel is disposed in the same closed space as that in the treatment vessel (in the treatment chamber of the treatment vessel), usually the dielectric component for the covering is also disposed in the same closed space as that in the treatment vessel. In this case, a large force like a gas pressure difference between a substantially atmospheric pressure and a substantially/approximately vacuum pressure is not applied to the dielectric component for the covering. Therefore, even when the plasma treatment apparatus is enlarged, strength does not have to be imparted to the dielectric component for the covering. Therefore, there is not any cost increase incurred when the dielectric component for the covering is formed into high strength (thickness is increased). Since the dielectric component for the covering can be designed to be comparatively thin, the influence of the dielectric component for the covering on the propagation of the electromagnetic wave is also reduced. Therefore, an apparatus for uniformly radiating the electromagnetic wave into the treatment vessel is also easily designed.

It is to be noted that as the dielectric component for the covering, a component whose surface inside the treatment vessel is formed into a flat face is usable. In this case, the propagation of the surface wave can be inhibited from being interrupted by the exposed surface of the dielectric component for the covering, the plasma easily spreads not only around the slots from which the electromagnetic wave is discharged but also on the whole surface. Therefore, a large-sized plasma treatment apparatus capable of plasma-treating the component to be treated like the large-area substrate can be easily designed. There can be provided a plasma treatment apparatus having a small footprint and a uniform plasma density.

On the other hand, as the dielectric component for the covering, a component whose surface inside the treatment vessel has irregularity may be used. In this case, the propagation of a specific mode of the surface wave can be inhibited. Therefore, an in-plane distribution of the plasma attributed to the mode can be improved. Also in this case, a large-sized plasma treatment apparatus capable of plasma-treating the component to be treated like the large-area substrate can be easily designed. Moreover, the plasma treatment apparatus having a small footprint and a uniform plasma density can be provided.

Moreover, a cooling tube is disposed as a cooling mechanism in a region between slots disposed adjacent to each other in the wall of the treatment vessel, and a refrigerant (fluid) may be circulated in the cooling tube. Thus, the electromagnetic wave transmission path can be cooled by the refrigerant with good efficiency without inhibiting the generation of the plasma.

A plasma treatment apparatus described in the present invention is the plasma treatment apparatus of the present invention, wherein a dielectric component is disposed in the slot.

When the dielectric component is disposed in the electromagnetic wave transmission path disposed in the wall of the treatment vessel (in the waveguide for the electromagnetic wave radiation in the case where the electromagnetic wave transmission path has the waveguide for the electromagnetic wave radiation), the electromagnetic wave transmission path is filled with the electromagnetic, and the slots are filled, for example, with air. That is, since dielectric constant in the electromagnetic wave transmission path becomes different from that in the slot, a part of the electromagnetic wave transmitted by the electromagnetic wave transmission path is reflected by an interface with the slot. A part of the electromagnetic wave is reflected even in an interface between the slot and the dielectric component for the covering.

On the other hand, when the dielectric component is disposed in the slot, a difference between the dielectric constant in the electromagnetic wave transmission path and that in the slot can be reduced, and reflection of the electromagnetic wave in the interface between the electromagnetic wave transmission path and the slot can be inhibited. Since the difference between the dielectric constant in the slot and that of the dielectric component for the covering can also be reduced, the reflection of the electromagnetic wave in the interface between the slot and the dielectric component for the covering can be inhibited.

That is, since the slot and the electromagnetic wave transmission path (waveguide) is filled with a dielectric, unnecessary microwave reflected wave in this portion is not generated, and uniform supply of the electromagnetic wave (microwave) is possible.

A plasma treatment apparatus described in the present invention is the plasma treatment apparatus described in the present invention, wherein the electromagnetic wave transmission path comprises a plurality of square waveguides for electromagnetic wave radiation, and the plurality of slots are corresponded to an E face (electric field face) or an H face (magnetic field face) of the square waveguides for the electromagnetic wave radiation.

Thus, the structure can be simplified, and a plasma treatment apparatus capable of satisfactorily plasma-treating even the component to be treated, for example, the square substrate or the large-area substrate can be realized.

When the plurality of slots are disposed in the H face, the slots are disposed in a face having a long side of a square waveguide section as one side, and therefore working of the slots, and adjustment of positions of the slots are facilitated. Since a large slot width is obtained, more electromagnetic wave can be radiated.

When the plurality of slots are disposed in the E face, the slots are disposed in a face having a short side of the square waveguide section as one side. Therefore, in a case where the square waveguides are arranged in parallel with one another at a certain interval in a certain area, more square waveguides can be arranged as compared with a case where the plurality of slots are arranged in the H face. Accordingly, uniformity of the electromagnetic wave can be raised.

A plasma treatment apparatus described in the present invention is the plasma treatment apparatus described in the present invention, wherein an inner sectional dimension of each of the plurality of square waveguides for electromagnetic wave radiation is set to a size capable of transmitting the frequency of the electromagnetic wave in a fundamental mode in the square waveguide, and these square waveguides for the electromagnetic wave radiation are arranged in parallel with one another and the interval is set to 50 cm or less.

When the frequency of the electromagnetic wave is transmitted in a fundamental mode in the square waveguide, for example, assuming that an in-tube dielectric constant of a square waveguide for electromagnetic wave radiation is $\in$, a long diameter of an inner sectional dimension of the square waveguide for the electromagnetic wave radiation is a, and a wavelength of the electromagnetic wave is $\lambda$, the apparatus can be realized by designing the apparatus to satisfy the following:

$$(\lambda/\in^{0.5}) < 2a \qquad (1).$$

An interval d (pitch) of the square waveguide for the electromagnetic wave radiation is preferably set in consideration of a degree of diffusion of the plasma. FIG. 11 shows a relation between a distance from a particle generation point and a particle density. As shown in FIG. 11, it is seen that the lower the pressure of a process gas is, the farther the particle diffuses.

When the pressure of the process gas is 1 Pa or less, the plasma easily diffuses, and therefore the interval d of the square waveguide for the electromagnetic wave radiation may exceed 50 cm. Additionally, in the plasma treatment apparatus, in general, the pressure of the process gas is generally set to approximately 1 Pa or more. The present inventors have found that in a case where the pressure of the process gas is 1 Pa or more, an upper limit is set to 50 cm, and an interval d of the square waveguide for the electromagnetic wave radiation is set in accordance with the assumed pressure of the process gas, and then a uniform plasma is generated even in a condition on which the plasma does not easily diffuse.

As described above, when the frequency of the electromagnetic wave is set to be transmittable in the fundamental mode in the square waveguide, propagation loss amount of the electromagnetic wave for generating the plasma in the square waveguide for the electromagnetic wave radiation can be reduced. Additionally, when the interval d of the square waveguide for the electromagnetic wave radiation is set to 50 cm or less, the plasma can be satisfactorily and uniformly diffused even on a condition that the plasma does not easily diffuse, for example, in a case where the pressure of the process gas in the treatment vessel is high.

A plasma treatment apparatus described in of the present invention is the plasma treatment apparatus described in the present invention, wherein assuming that an in-tube dielectric constant of the square waveguide for the electromagnetic wave radiation is .epsilon., a long diameter of an inner sectional dimension of the square waveguide for the electromagnetic wave radiation is a has the following relation with respect to a wavelength .lambda. of the electromagnetic wave:

$$(\lambda/\epsilon^{0.5}) < 2a \quad (1),$$

assuming that an angular frequency of the electromagnetic wave is ω, a dielectric constant of the dielectric component for the covering is $\epsilon_d$, light velocity is c, a charge amount of an electron is e, a dielectric constant of vacuum is $\epsilon_0$, an electron density is $n_e$, and mass of the electron is $m_e$, the following wave number k defined by them and a plasma angular frequency $\omega_P$ has the following relation with an inner dimension L of a direction crossing, at right angles, the square waveguide for the electromagnetic wave radiation of the treatment vessel:

$$\omega_P = (e^2 \times n_e/(\epsilon_0 \times m_e))^{0.5} \quad (2);$$

$$k = \omega/c((\epsilon_d(\omega_P^2 - \omega^2))/(\omega_P^2 - (1+\epsilon_d)\omega^2))0.5 \quad (3);$$

and $$k = m\pi/L (m \text{ is an integer of } 1 \leq m \leq 2L/(\lambda/\epsilon^{0.5})) \quad (4),$$

and the square waveguide for the electromagnetic wave radiation is disposed at an interval of a wavelength $\lambda_{swp}$ of a standing wave derived by the following and in a position in which an amplitude of the standing wave is substantially maximum:

$$\lambda_{swp} = \pi/k \quad (5)$$

FIG. 12 schematically shows a standing wave of m=1 in the treatment vessel, and FIG. 13 schematically shows a standing wave of m=2 $L/(\lambda/\epsilon^{0.5})$ in the treatment vessel. As seen from FIGS. 12 and 13, when a range of m in the equation (4) is set to an integer of $1 \leq m \leq 2 L/(\lambda/\epsilon^{0.5})$, the wavelength $\lambda_{swp}$ of the standing wave can be obtained.

When the square waveguides for the electromagnetic wave radiation are arranged at the interval of the wavelength $\lambda_{swp}$ of a low-order standing wave of the surface wave, and in the vicinity of a position where the amplitude of the standing wave is maximum, the energy of the electromagnetic wave can be supplied to the surface wave with good efficiency.

It is to be noted that the distance between the inner faces of the adjacent square waveguides for the electromagnetic wave radiation may be set to be smaller than a width between the inner faces of one square waveguide for the electromagnetic wave radiation. Thus, a large-sized plasma treatment apparatus for plasma-treating the component to be treated like the large-area substrate can be easily designed. There can be provided a plasma treatment apparatus having a small footprint and a uniform plasma density.

A plasma treatment apparatus described in the present invention is the plasma treatment apparatus described in the present invention, wherein a dielectric component is disposed in at least a part of a region of the electromagnetic wave transmission path positioned in the treatment vessel, a dielectric component is disposed in the slot, and the dielectric component in the electromagnetic wave transmission path has a dielectric constant in a frequency band of the electromagnetic wave, which is substantially equal to that of the dielectric component in the slot.

As described above, when the dielectric component is disposed in the slot, a dielectric constant difference between the electromagnetic wave transmission path including the dielectric component therein and the slot can be reduced. Therefore, the electromagnetic wave which has propagated in the electromagnetic wave transmission path having the dielectric component therein can be inhibited from being reflected by an interface with the slot, and therefore the electromagnetic wave can be radiated in the treatment vessel with good efficiency.

Additionally, since the dielectric component in the electromagnetic wave transmission path, and that in the slot are constituted to have a substantially equal dielectric constant in the frequency band of the electromagnetic wave, the reflection of the electromagnetic wave in the interface between the electromagnetic wave transmission path and the slot can be substantially eliminated. Accordingly, the electromagnetic wave can be supplied into the treatment vessel further with good efficiency.

A plasma treatment apparatus described in the present invention is the plasma treatment apparatus described in the present invention, wherein the dielectric component for the electromagnetic wave transmission path is formed of at least one of quartz, alumina, and fluorocarbon resin.

Thus, the loss of the electromagnetic wave by dielectric loss can be suppressed. When fluorocarbon resin is used as the dielectric component in the electromagnetic wave transmission path, the loss of the electromagnetic wave by the dielectric loss is suppressed, and a waveguide weight can be reduced as compared with a case where an inorganic dielectric component such as quartz is used. Additionally, breakage by impact or the like does not easily occur as compared with the use of the inorganic dielectric component like quartz.

A plasma treatment apparatus described in the present invention is the plasma treatment apparatus described in the present invention, which further comprises an electromagnetic wave source and wherein the electromagnetic wave transmission path comprises a waveguide for electromagnetic wave distribution which distributes an electromagnetic wave generated by the electromagnetic wave source to the plurality of square waveguides for the electromagnetic wave radiation, a dielectric component is disposed in the electromagnetic wave transmission path, air tightness of the treatment vessel is held by the dielectric component, and the electromagnetic wave is introduced into the treatment vessel from the outside of the treatment vessel through the dielectric component.

Thus, the electromagnetic wave can be introduced into the treatment vessel from the outside of the treatment vessel without complicating the constitutions of the treatment vessel and the plasma treatment apparatus itself and while keeping the air tightness of the treatment vessel. In general, the dielectric component easily breaks and is expensive. However, by the above-described constitution, an area of a region in which an atmospheric pressure is applied to the dielectric component for holding the treatment vessel in an airtight manner can be set to be approximately equal to sectional areas of the plurality of waveguides for the electromagnetic wave radiation. Additionally, since the dielectric component for holding the treatment vessel in the airtight manner is disposed in the electromagnetic wave transmission path, the invasion of the plasma generated in the treatment vessel into the electromagnetic wave transmission path can be inhibited. Furthermore, the apparatus is easily designed in consideration of the flow or the like of the process gas, and degassing, cleaning or the like in the treatment vessel is also facilitated.

Moreover, in the constitution in which the electromagnetic wave is distributed to a plurality of waveguides for electromagnetic wave radiation from one waveguide for electromagnetic wave distribution, a sealing place for keeping the air tightness of the treatment vessel can be one place corresponding approximately to the sectional area of the waveguide for the electromagnetic wave distribution. By this constitution, the constitution of the plasma treatment apparatus can be simplified. It is to be noted that even in this case, the air tightness of the treatment vessel can be kept by the dielectric component which holds the treatment vessel in the airtight manner.

It is to be noted that "the plurality of square waveguides for the electromagnetic wave radiation and the wall constituting the treatment vessel are integrated" includes not only a constitution in which the plurality of square waveguides for the electromagnetic wave radiation and the wall constituting the treatment vessel are integrally formed but also an integral structure in which the waveguide for the electromagnetic wave radiation is coupled to the wall constituting the treatment vessel. The dielectric component which holds the treatment vessel in the airtight manner may be an integral molded article with respect to the dielectric component in the electromagnetic wave transmission path. That is, a part of the dielectric component in the electromagnetic wave transmission path may also serve as the dielectric component which holds the treatment vessel in the airtight manner.

A plasma treatment apparatus described in the present invention is the plasma treatment apparatus described in the present invention, wherein the plurality of square waveguides for the electromagnetic wave radiation are disposed to be branched from an E face or an H face of the waveguide for the electromagnetic wave distribution.

A plasma treatment apparatus described in the present invention is the plasma treatment apparatus described in the present invention, wherein the waveguide for the electromagnetic wave distribution is bent at right angles in such a manner that a propagation direction of the electromagnetic wave changes by 90.degree., and the electromagnetic wave whose propagation direction has been changed by 90.degree. is distributed to the plurality of square waveguides for the electromagnetic wave radiation.

By this constitution, a large-sized plasma treatment apparatus capable of plasma-treating the component to be treated like the large-area substrate can be easily designed. A plasma treatment apparatus having a small footprint and a uniform plasma density can be provided.

A plasma treatment apparatus described in the present invention is the plasma treatment apparatus described in the the present invention, wherein the plurality of square waveguides for the electromagnetic wave radiation are branched from the E face of the waveguide for the electromagnetic wave distribution, and the plurality of waveguides for the electromagnetic wave radiation and the waveguide for the electromagnetic wave distribution are arranged substantially on the same plane.

Since the plurality of waveguides and the waveguide for the electromagnetic wave distribution are arranged substantially on the same plane, a large-sized plasma treatment apparatus capable of plasma-treating the component to be treated like the large-area substrate can be easily designed without enlarging the plasma treatment apparatus or without designing a large sectional area of a sealing place for keeping the air tightness of the treatment vessel. A plasma treatment apparatus having a small footprint and a uniform plasma density can be provided.

In a plasma treatment apparatus described in the present invention, a dielectric component for the electromagnetic wave transmission path is disposed in at least a part of a region of the electromagnetic wave transmission path positioned in the treatment vessel, the dielectric component is disposed in the slot, and the dielectric component in the electromagnetic wave transmission path, the dielectric component in the slot, and the dielectric component for the covering are integrally assembled.

Thus, in a case where the dielectric component in the slot breaks, or the dielectric component in the slot needs to be replaced by re-designing the slot or the like, the dielectric component in the slot can be easily changed. Therefore, a plasma treatment apparatus whose maintenance is easy can be provided.

A plasma treatment apparatus described in the present invention is the plasma treatment apparatus described in the present invention, wherein the dielectric component for the covering is fixed by a fixing component formed of a dielectric material.

By this constitution, disturbance of the electromagnetic wave in a place where the dielectric component for the covering is fixed can be suppressed. Therefore, a large-sized plasma treatment apparatus capable of plasma-treating the component to be treated like the large-area substrate can be easily designed. A plasma treatment apparatus having a small footprint and a uniform plasma density can be provided.

A plasma treatment apparatus described in the present invention is the plasma treatment apparatus described in the present invention, wherein the dielectric component for the covering is formed into a plate shape which covers the slot plate, and a thickness of the dielectric component is set to be smaller than ¼ of a wavelength of the electromagnetic wave in the dielectric component for the covering.

By this constitution, the electromagnetic wave can be inhibited from being allowed to propagate in a thickness direction of the dielectric component for the covering. That is, the only surface wave can be selectively allowed to propagate in the dielectric component for the covering. Therefore, a large-sized plasma treatment apparatus capable of plasma-treating the component to be treated like the large-area substrate can be easily designed. A plasma treatment apparatus having a small footprint and a uniform plasma density can be provided.

A plasma treatment apparatus described in the present invention is the plasma treatment apparatus described in the present invention, wherein an interval between the electromagnetic wave transmission path and a dielectric component which holds the treatment vessel in an airtight manner or the dielectric component in the electromagnetic wave transmission path is set to 1 mm or less.

In general, the electromagnetic wave transmission path is formed of a dielectric material. Therefore, when the interval between the path and the dielectric component for holding the treatment vessel in the airtight manner or the dielectric component in the electromagnetic wave transmission path exceeds 1 mm, there is a possibility that abnormal discharge occurs between the inner face of the electromagnetic wave transmission path and the dielectric component for holding the treatment vessel in the airtight manner or the dielectric component in the electromagnetic wave transmission path.

Therefore, the interval between the electromagnetic wave transmission path and the dielectric component for holding the treatment vessel in the airtight manner or the dielectric component in the electromagnetic wave transmission path is preferably set to 1 mm or less. By this constitution, the abnormal discharge caused in a gap between the electromagnetic wave transmission path and the dielectric component for holding the treatment vessel in the airtight manner or the dielectric component in the electromagnetic wave transmission path can be inhibited. Therefore, a stable plasma can be generated in the treatment vessel.

A plasma treatment apparatus described in the present invention is the plasma treatment apparatus described in the present invention, which further comprises an electromagnetic wave source which supplies an electromagnetic wave having a frequency of 10 MHz to 25 GHz to the electromagnetic wave transmission path.

At least one or more electromagnetic wave sources may be disposed. By the use of a plurality of electromagnetic wave sources, a desired output can be obtained without increasing a maximum output of each electromagnetic wave source. Additionally, in a case where a plurality of electromagnetic wave sources are used, when the electromagnetic wave sources disposed adjacent to each other have an equal frequency, the generated plasmas easily interfere with each other. Therefore, in a case where a plurality of electromagnetic wave sources are used, the adjacent electromagnetic wave sources are preferably set to have different frequencies.

Moreover, as an electromagnetic wave source, a source is preferably usable which supplies electromagnetic waves having frequencies of an industrial frequency band (ISM frequency band) of 13.56 MHz, 27.12 MHz, 40.68 MHz, 915 MHz, 2.45 GHz, 5.8 GHz, and 24.125 GHz. Thus, since an influence on a frequency band for communication can be reduced, screening of leak electromagnetic wave and the like can be easily performed.

A plasma treatment apparatus described in the present invention is the plasma treatment apparatus described in the present invention, wherein the electromagnetic wave source supplies an electromagnetic wave having a frequency of 2.45 GHz.+−0.50 MHz to the electromagnetic wave transmission path.

A frequency of a microwave source is 2.45 GHz which is a standard at present. Therefore, the electromagnetic wave source is inexpensive, and has a variety of types. Since the frequency range is set to 2.45 GHz±50 MHz, an industrial frequency band is achieved, the influence on the frequency band for the communication can be reduced, and the screening of the leak electromagnetic wave of the apparatus or the like is facilitated. Thus, the microwaves can be supplied as the electromagnetic waves into the treatment vessel.

A plasma treatment apparatus described in the present invention is the plasma treatment apparatus described in the present invention, wherein plasma oxidation, plasma film forming, or plasma etching is performed under a surface wave plasma condition.

According to the plasma treatment apparatus described in the present invention, while ion damages on the component to be treated are suppressed, the component to be treated can be subjected to a oxidation process, film forming, or etching process.

The plasma treatment apparatus described in the present invention is preferably usable in carrying out a plasma treatment method in which the component to be treated is disposed inside the treatment vessel, the plasma is generated inside the treatment vessel, and accordingly the component to be treated is plasma-treated by the plasma. The electromagnetic wave is transmitted in the electromagnetic wave transmission path disposed in the wall of the treatment vessel, the electromagnetic wave is radiated toward the inside of the treatment vessel by the electromagnetic wave radiation portion electromagnetically coupled to the electromagnetic wave transmission path, and accordingly the plasma is generated in the treatment vessel.

In a plasma treatment method of the present invention, plasma oxidation and film forming by a plasma CVD process are continuously performed using the plasma treatment apparatus described in the present invention without breaking vacuum.

According to this plasma treatment method, after subjecting the component to be treated to the oxidation process, the film forming process can be performed without being exposed to the atmosphere. Therefore, an interface between the component to be treated and a film can be formed into a satisfactory interface having little contamination, and a film having a satisfactory quality can be formed on the component to be treated. Both processes can be performed by the same apparatus, a footprint can be formed to be small, and the apparatus can be manufactured inexpensively.

A plasma treatment apparatus described in the present invention comprises a treatment vessel, an oscillator which oscillates an electromagnetic wave, a first electromagnetic wave transmission path, a second electromagnetic wave transmission path whose inner dimension is set to be smaller than that of the first electromagnetic wave transmission path and in which a dielectric component is disposed, and an electromagnetic wave radiation portion which is disposed in the second electromagnetic wave transmission path and which radiates the electromagnetic wave into the treatment vessel. The electromagnetic wave generated by the oscillator is introduced into the second electromagnetic wave transmission path via the first electromagnetic wave transmission path, and radiated into the treatment vessel by the electromagnetic wave radiation portion. Accordingly, a plasma is generated in the treatment vessel, and plasma treatment is performed by the plasma. The first electromagnetic wave transmission path is coupled to the second electromagnetic wave transmission path via a hollow third electromagnetic wave transmission path formed in such a manner that an inner dimension is reduced toward a transmission side of the electromagnetic wave, and a wedge-shaped dielectric component is disposed to expand/open toward the transmission side in the third electromagnetic wave transmission path.

In the present invention and the following inventions, the "electromagnetic wave transmission path" refers to a line for transmitting the electromagnetic wave with high efficiency. Examples of the electromagnetic wave transmission path include a coaxial tube, a waveguide, a cavity resonator and the like.

Since the coaxial tube has a large loss (propagation loss) as compared with the waveguide, but does not have a cutoff frequency, a transmittable frequency range is broad, and the transmission path can be miniaturized even in a case where a wavelength is large.

Since a central conductor causing the loss in the coaxial tube is not disposed in the waveguide, the loss is small, and the waveguide is suitable for the transmission of a large power. However, the cutoff frequency exists, and the transmittable frequency range is small. The shape is substantially defined by the frequency of the electromagnetic wave to be transmitted.

The cavity resonator is designed in such a manner that a standing wave stands with respect to a specific frequency, and has a function of intensifying the electromagnetic wave having the wavelength.

The "electromagnetic wave radiation portion" refers to a portion which discharges the electromagnetic wave transmitted through the electromagnetic wave transmission path to the outside of the electromagnetic wave transmission path. Examples of the electromagnetic wave radiation portion include a slot, conductor rod, electromagnetic horn and the like.

The third electromagnetic wave transmission path can be formed, for example, into a substantially conical shape having a taper whose inner dimension is reduced toward the transmission side (wave guiding direction of the electromagnetic wave) of the electromagnetic wave, but the present invention is not limited to this shape. Considering from workability of the third electromagnetic wave transmission path, the path is preferably formed separately from the first and second electromagnetic wave transmission paths, but may be formed integrally with the first or second electromagnetic wave transmission path.

To apply the electromagnetic wave into the wedge-shaped dielectric component in a state in which there is little propagation loss (little reflection), the wedge-shaped dielectric component is preferably formed into a wedge shape expanding/opening toward the transmission side of the electromagnetic wave, for example, a wedge shape whose side face shape is a substantially isosceles triangular shape.

In the plasma treatment apparatus described in of the present invention, since the dielectric component is disposed in the second electromagnetic wave transmission path, invasion of the plasma into the first and second electromagnetic wave transmission paths can be inhibited.

Additionally, in the plasma treatment apparatus described in the present invention, the first electromagnetic wave transmission path is coupled to the second electromagnetic wave transmission path via the hollow third electromagnetic wave transmission path which also functions as a connection mechanism formed in such a manner that the inner dimension is reduced toward the transmission side of the electromagnetic wave. Therefore, reflection of the electromagnetic wave can be inhibited from being caused by an area change of an inner shape of the electromagnetic wave transmission path between the first and second electromagnetic wave transmission paths.

Moreover, in general, in a case where the electromagnetic wave transmitted in air enters the dielectric component, the larger an angle $\theta$ ($0°\leq\theta\leq90°$, $\theta$ will be hereinafter referred to as an incidence angle) formed by an end face of the dielectric component and a transmission direction of the electromagnetic wave is, the more easily the electromagnetic wave is reflected by the end face.

In the plasma treatment apparatus described in the Jpn. Pat. Appln. No. 2002-366842, the dielectric component in the waveguide is disposed in such a manner that the end face crosses the transmission direction at right angles. That is, since an incidence angle $\theta$ at a time when the electromagnetic wave transmitted in the air enters the dielectric component in the waveguide is set to approximately 90°, the electromagnetic wave is comparatively easily reflected by the end face of the dielectric component, that is, the interface between the air and the dielectric component.

On the other hand, in the plasma treatment apparatus described in the present invention, the wedge-shaped dielectric component formed to expand/open toward the transmission side of the electromagnetic wave is disposed in the third electromagnetic wave transmission path which connects the first electromagnetic wave transmission path to the second electromagnetic wave transmission path. Thus, the incidence angle .theta. at a time when the electromagnetic wave transmitted in the air enters the wedge-shaped dielectric component can be set to be less than 90.degree., and therefore the electromagnetic wave can be applied into the wedge-shaped dielectric component with good efficiency.

Additionally, the dielectric constant of the wedge-shaped dielectric component is higher than that of the air, and therefore a ratio at which the electromagnetic wave reflects in the interface between the wedge-shaped dielectric component and the dielectric component in the second electromagnetic wave transmission path is considerably smaller than that at which the electromagnetic wave reflects in the interface between the air and the dielectric component in the second electromagnetic wave transmission path. Therefore, the electromagnetic wave transmitted by the first electromagnetic wave transmission path can be applied into the second electromagnetic wave transmission path via the wedge-shaped dielectric component disposed in the third electromagnetic wave transmission path with good efficiency.

Therefore, according to the plasma treatment apparatus described in the present invention, the electromagnetic wave can be allowed to propagate with good efficiency.

A plasma treatment apparatus described in the present invention is the plasma treatment apparatus described in the present invention, wherein the wedge-shaped dielectric component is disposed in such a manner that a top side of the component is positioned in an end portion of the first electromagnetic wave transmission path on the transmission side or a region in the vicinity of the end portion.

By this constitution, a reflection amount by which the electromagnetic wave reflects in the interface between the air and the wedge-shaped dielectric component can be further reduced.

It is to be noted that the top side of the wedge-shaped dielectric component and the end portion of the first electromagnetic wave transmission path on the transmission side are preferably positioned on the same plane. Additionally, it is difficult to completely match the top side of the wedge-shaped dielectric component with the end portion of the first electromagnetic wave transmission path on the transmission side because of an error in manufacturing the apparatus itself or the wedge-shaped dielectric component. Even when the top side of the wedge-shaped dielectric component is slightly distant from the end portion of the first electromagnetic wave transmission path on the transmission side, an effect substantially equivalent to that in complete agreement can be obtained. Therefore, "the wedge-shaped dielectric component is disposed in such a manner that the top side of the component is positioned in the end portion of the first electromagnetic wave transmission path on the transmission side or the region in the vicinity of the end portion" means that the error or the like in the manufacturing or slight shift is permitted.

A plasma treatment apparatus described in the present invention is the plasma treatment apparatus described in the present invention, wherein air tightness of the treatment vessel is held by the wedge-shaped dielectric component or the dielectric component in the second electromagnetic wave transmission path.

For example, to connect a rectangular waveguide disposed outside the treatment vessel of the first electromagnetic wave transmission path to a rectangular waveguide disposed in the wall of the treatment vessel disposed in the second electromagnetic wave transmission path, a sealing component needs to be disposed in order to keep the air tightness of the treatment vessel. In the plasma treatment apparatus described in the present invention, the rectangular waveguide disposed outside the treatment vessel of the first electromagnetic wave transmission path is coupled to that disposed in the wall of the treatment vessel of the second electromagnetic wave transmission path. Accordingly, the apparatus is suitable for the above-described case, that is, in a case where the treatment vessel is integrated with the first electromagnetic wave transmission path.

By this constitution, the electromagnetic wave can be satisfactorily introduced into the second electromagnetic wave transmission path disposed in the treatment vessel from the first electromagnetic wave transmission path disposed outside the treatment vessel without complicating the constitutions of the treatment vessel and the plasma treatment apparatus itself and while keeping the air tightness of the treatment vessel.

Moreover, in general, the dielectric component easily breaks and is expensive. On the other hand, by the above-described constitution, an area of a region in which an atmospheric pressure is applied to the wedge-shaped dielectric component or the dielectric component in the second electromagnetic wave transmission path can be set to be an approximately inner dimension of the rectangular waveguide of the second electromagnetic wave transmission path. That is, by the constitution, since a load applied to the wedge-shaped dielectric component functioning also as the dielectric component for holding the air tightness of the treatment vessel, or the dielectric component in the second electromagnetic wave transmission path can be comparatively reduced, the breakage of the dielectric component can be suppressed.

Additionally, since the dielectric component (the wedge-shaped dielectric component or the dielectric component in the electromagnetic wave transmission path) for holding the air tightness of the treatment vessel is disposed in the third or second electromagnetic wave transmission path, the invasion of the plasma generated in the treatment vessel into the first electromagnetic wave transmission path can be inhibited. Furthermore, the apparatus is easily designed in consideration of the flow of the process gas or the like, and degassing, cleaning and the like in the treatment vessel are facilitated.

A plasma treatment apparatus described in the present invention is the plasma treatment apparatus described in the present invention, wherein a distance between an end portion of the first electromagnetic wave transmission path on the transmission side and an end portion of the second electromagnetic wave transmission path on a side opposite to the transmission side is set to be longer than a wavelength of the electromagnetic wave generated in the oscillator in vacuum.

Consequently, the reflection of the electromagnetic wave by the area change of the inner shape of the electromagnetic wave transmission path, and the reflection in the interface between the air and the wedge-shaped dielectric component can further be inhibited.

A plasma treatment apparatus described in the present invention is the plasma treatment apparatus described in the present invention, wherein the first and second electromagnetic wave transmission paths have rectangular waveguides.

Consequently, the transmission losses of the electromagnetic waves in the first and second electromagnetic wave transmission paths can be suppressed. Moreover, the transmission of the large power is possible.

A plasma treatment apparatus described in the present invention is the plasma treatment apparatus described in the present invention, wherein each of an inner dimension of a rectangular waveguide disposed in the first electromagnetic wave transmission path, and that of a rectangular waveguide disposed in the second electromagnetic wave transmission path is set to a size capable of transmitting a frequency of the electromagnetic wave generated in the oscillator in a fundamental mode in the rectangular waveguide.

In the case where the frequency of the electromagnetic wave can be transmitted in the fundamental mode in the rectangular waveguide, for example, assuming that an in-tube dielectric constant of the rectangular waveguide is $\in$, a long diameter of the inner dimension of the rectangular waveguide is a, and a wavelength of the electromagnetic wave is $\lambda$, the transmission can be realized, when the apparatus is designed to satisfy the following condition:

$$(\lambda/\in^{0.5}) < 2a \qquad (1).$$

Thus, each of the inner dimension of the rectangular waveguide disposed in the first electromagnetic wave transmission path, and that of the rectangular waveguide disposed in the second electromagnetic wave transmission path is set in such a manner that the frequency of the electromagnetic wave generated in the oscillator is transmittable in the fundamental mode in the rectangular waveguide, and accordingly a transmission loss amount of the electromagnetic wave in each rectangular waveguide can be reduced.

A plasma treatment apparatus described in the present invention is the plasma treatment apparatus described in the present invention, wherein a length of the top side of the wedge-shaped dielectric component is set to be substantially equal to that of a long side of the inner shape of the rectangular waveguide disposed in the second electromagnetic wave transmission path. Moreover, the wedge-shaped dielectric component has a top side extending substantially in parallel with a long side direction of an inner diameter of the rectangular waveguide disposed in the second electromagnetic wave transmission path, and is substantially disposed on a line connecting a midpoint of a short side to another midpoint of another short side.

By this constitution, the electromagnetic wave transmitted by the first electromagnetic wave transmission path can be applied into the second electromagnetic wave transmission path via the wedge-shaped dielectric component disposed in the third electromagnetic wave transfer path with better efficiency.

A plasma treatment apparatus described in the present invention is the plasma treatment apparatus described in the present invention, wherein a length of the wedge-shaped dielectric component along a transmission direction of the electromagnetic wave is set to be longer than a wavelength of the electromagnetic wave generated by the oscillator in vacuum.

By this constitution, the reflection of the electromagnetic wave by the area change of the inner shape of the electromagnetic wave transmission path, and the reflection in the interface between the air and the wedge-shaped dielectric component can further be inhibited.

A plasma treatment apparatus described in the present invention is the plasma treatment apparatus described in the present invention, wherein a wall of the treatment vessel has at least a part of the second electromagnetic wave transmission path.

According to a plasma treatment apparatus described in the present invention, since a wall of the treatment vessel has at least a part of the second electromagnetic wave transmission path, the constitutions of the treatment vessel and the plasma apparatus itself can be simplified. Additionally, when a shape or arrangement of the second electromagnetic wave transmission path is adjusted, a stable and uniform plasma can be generated in the treatment vessel regardless of the size or shape of the treatment vessel. Therefore, even the component to be treated like the square substrate or the large-area substrate can be satisfactorily plasma-treated.

To carry out the plasma treatment apparatus described in of the present invention, at least a part of the second electromagnetic wave transmission path can be disposed, for example, in the wall of the treatment vessel. That is, in the plasma treatment apparatus described in the present invention, for example, a tunnel-shaped space extending through the wall is disposed along the wall, and accordingly at least a part of the second electromagnetic wave transmission path can be disposed in the wall of the treatment vessel.

Additionally, considering from ease of working the wall, the treatment vessel having the treatment chamber in which the component to be treated is plasma-treated is adopted, and at least a part of the second electromagnetic wave transmission path is preferably disposed in the inner face of the wall defining the treatment chamber among the walls of the treatment vessel. In this case, since at least a part of the second electromagnetic wave transmission path can be defined by the inner face of the wall of the treatment vessel, a part of the second electromagnetic wave transmission path can be disposed in the wall of the treatment vessel more easily than in a case where a part of the second electromagnetic wave transmission path is disposed to extend through the wall of the treatment vessel.

Moreover, in a case where at least a part of the second electromagnetic wave transmission path is disposed in the inner face of the wall defining the treatment chamber among the walls of the treatment vessel, a concave portion defining at least a part of the second electromagnetic wave transmission path is disposed in the inner face of the wall, a slot plate having a plurality of slots is adopted as the electromagnetic wave radiation portion, and the concave portion may be covered with this slot plate from a treatment chamber side. It is to be noted that at this time a plurality of slots are disposed facing the concave portions. Accordingly, the second electromagnetic wave transmission path can be disposed in a space surrounded with the wall face defining the concave portion and the slot plate. Additionally, the electromagnetic wave transmitted by the second electromagnetic wave transmission path can be radiated in the treatment chamber via the slots.

Moreover, in a constitution in which the concave portion defining at least a part of the second electromagnetic wave transmission path is disposed in the inner face of the wall, and the concave portion is covered with the slot plate from the side of the treatment chamber, the second electromagnetic wave transmission path is disposed in the same closed space as that of the treatment chamber. Therefore, the electromagnetic wave can be applied into the treatment chamber without disposing any electromagnetic wave transmission window formed of quartz or the like in the treatment vessel.

That is, by the above-described constitution, the electromagnetic wave transmission window formed of quartz or the like does not have to be disposed in the treatment chamber, and therefore all sealing mechanisms in the electromagnetic wave transmission window or between the electromagnetic wave transmission window and the treatment vessel wall can be omitted. Therefore, the constitutions of the treatment vessel and the plasma apparatus itself can further be simplified.

Additionally, since the electromagnetic wave transmission window itself can be omitted, needless to say, strength (thickness of the quartz window) of the electromagnetic wave transmission window does not have to be considered. Therefore, the plasma treatment apparatus comprising a large-sized treatment vessel for the component to be treated having a large area can be easily designed. Additionally, there is not any cost rise accompanying the enlargement of the electromagnetic wave transmission window. Furthermore, since the influence of the electromagnetic wave transmission window on the propagation of the electromagnetic wave can be eliminated, the apparatus capable of uniformly radiating the electromagnetic wave in the treatment vessel can be easily designed. Therefore, a plasma treatment apparatus capable of plasma-treating even the component to be treated like the large-area substrate by the stable and uniform plasma is obtained.

In the constitution in which the concave portion defining at least a part of the second electromagnetic wave transmission path is disposed in the inner face of the wall, and the concave portion is covered with the slot plate from the side of the treatment chamber, a dielectric component for the covering may be disposed in the treatment chamber to cover the slot plate. In this case, the plasma can be satisfactorily generated in the treatment chamber by the electromagnetic wave radiated from the electromagnetic wave radiation portion.

Additionally, when the dielectric component for the covering is disposed in the treatment chamber to cover the slot plate, a surface wave plasma can be generated in the treatment chamber. That is, a predetermined process gas is introduced into the treatment vessel (treatment chamber), and the electromagnetic wave is applied into the treatment vessel. Then, the process gas is excited to thereby generate the plasma, and electron density in the plasma in the vicinity of a region face into which the electromagnetic wave is applied (the vicinity of the slots in the treatment chamber) increases. When the electron density in the plasma in the vicinity of the region into which the electromagnetic wave is applied increases, it is difficult to allow the electromagnetic wave to propagate in the plasma, and the wave decays in the plasma. Therefore, the electromagnetic wave does not reach a region distant from the vicinity of the region into which the electromagnetic wave is applied, and therefore the region in which the process gas is excited by the electromagnetic wave is limited to the vicinity of the region into which the electromagnetic wave is applied. Accordingly, a surface wave plasma is generated.

In the plasma treatment using the surface wave plasma, the component to be treated can be inhibited from being damaged by ions. That is, in a state in which the surface wave plasma is generated, a region in which energy by the electromagnetic wave is applied and electrolytic dissociation of a compound occurs is localized in the vicinity of the region into which the electromagnetic wave is applied in the treatment vessel. Therefore, the component to be treated is disposed in a position distant from the region into which the electromagnetic wave is applied by a predetermined distance in the treatment vessel, and accordingly electron temperature in the vicinity of the treated face of the component to be treated can be kept to be low. That is, since increase of electric field of a sheath, generated in the vicinity of the treated face of the component to be treated, can be inhibited, incidence energy of the ion into the component to be treated lowers, and the component to be treated is inhibited from being damaged by the ions.

Therefore, when the dielectric component for the covering is disposed in the treatment chamber to cover the slot plate, a plasma treatment apparatus capable of inhibiting the component to be treated from being damaged by the ions can be obtained.

Moreover, as the treatment vessel, there is a vessel in which a lid is removable from a vessel main body for cleaning or maintenance in the treatment chamber. In the treatment vessel in which the vessel main body is separate from the lid in this manner, the working for forming the electromagnetic wave transmission path or the designing of the apparatus can be easily performed when disposing at least a part of the second electromagnetic wave transmission path in the lid rather than when disposing at least a part of the second electromagnetic wave transmission path in the vessel main body.

Therefore, in a case where the plasma treatment apparatus described in the present invention is carried out, as the treatment vessel having the treatment chamber, a vessel is preferably adopted comprising: a vessel main body having a bottom wall and a peripheral wall and opening in at least one direction; and a lid which closes the opening in the vessel main body. A wall defining the treatment chamber among the walls of the treatment vessel, having the bottom wall and the peripheral wall of the vessel main body, and the lid is adopted. At least a part of the second electromagnetic wave transmission path is preferably disposed in the lid of the treatment vessel.

The plasma treatment apparatus and the plasma treatment method of the present invention are not limited to the above-described embodiments, and can be variously carried out without departing from the scope.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 11 is a diagram showing a relation between a distance from a particle generation point and particle density;

FIG. 12 is a diagram schematically showing a standing wave of m=1 in the vacuum vessel;

FIG. 13 is a diagram schematically showing a standing wave of m=2 L/($\lambda/\in^{0.5}$) in the vacuum vessel;

FIG. 14 is a top plan view showing a plasma treatment apparatus according to a fourth embodiment of the present invention;

FIG. 18 is a perspective view showing a dielectric component disposed in the vicinity of the third electromagnetic wave transfer path of the plasma treatment apparatus of FIG. 14;

FIG. 19 is a perspective view showing a dielectric component disposed in the vicinity of the third electromagnetic wave transfer path of the plasma treatment apparatus of FIG. 14; and FIG. 20 is a perspective view showing example of mode converters from circulator to rectangle wave guide.

DETAILED DESCRIPTION OF THE INVENTION

Figure 1:
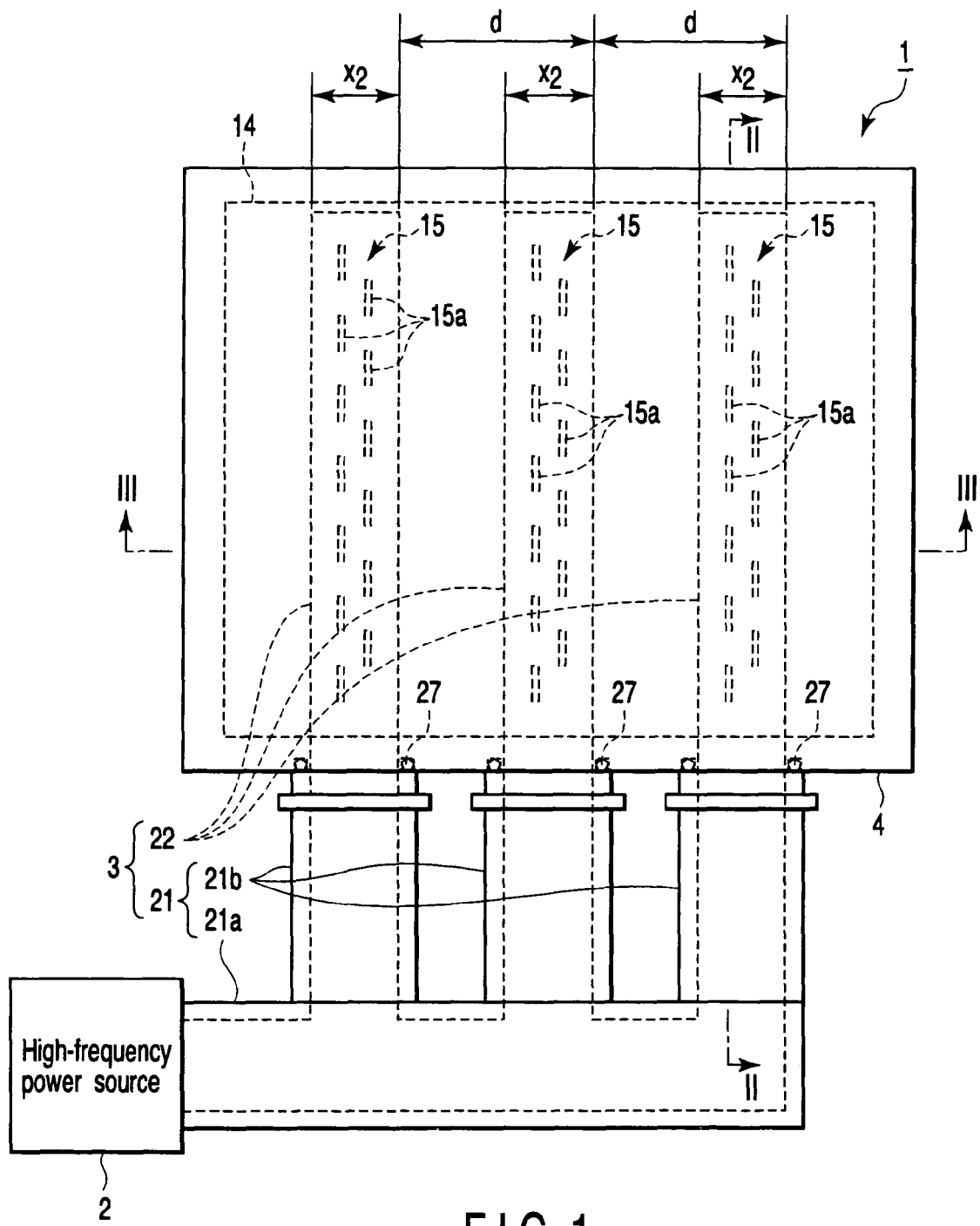
FIG. 1 is a top plan view showing a plasma treatment apparatus according to a first embodiment of the present invention.

A first embodiment of the present invention will be described hereinafter with reference to FIGS. 1 to 4.

In a plasma treatment apparatus 1 shown in FIGS. 1 to 4, a plasma is generated in a vacuum vessel 4 by an electromagnetic wave oscillated by a high-frequency power supply 2 which is an electromagnetic wave source, transmitted by an electromagnetic wave transmission path 3, and radiated into the vacuum vessel 4 which is a treatment vessel. A component 5 to be treated is plasma-treated by the plasma.

Figure 2:
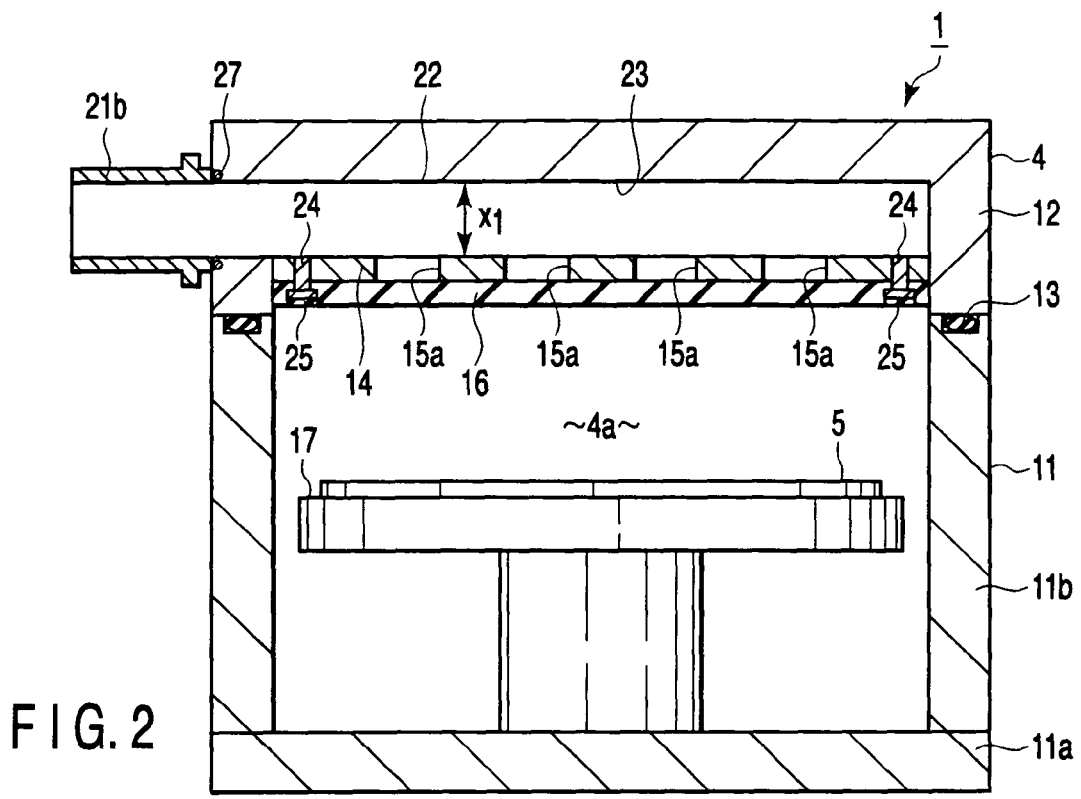
FIG. 2 is a sectional view along line II-II in FIG. 1.
Figure 3:
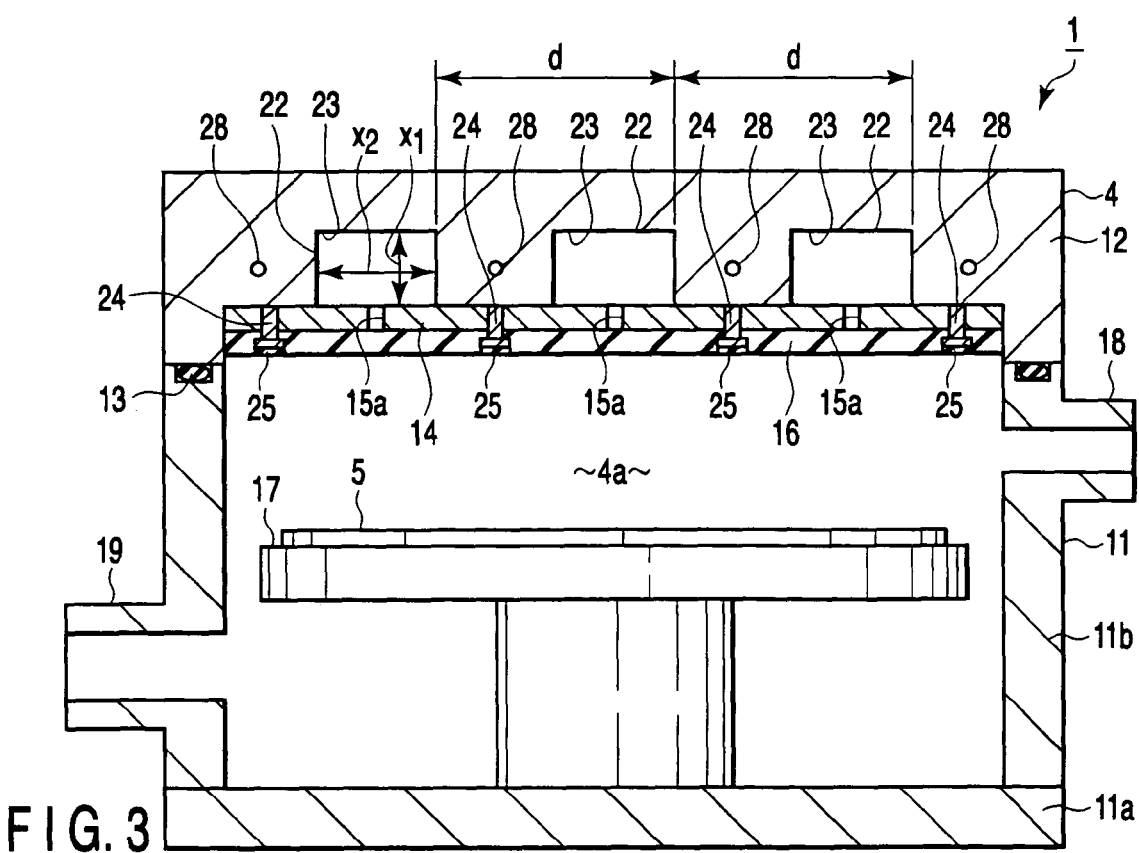
FIG. 3 is a sectional view along line III-III in FIG. 1.

As shown in FIGS. 2 and 3, the vacuum vessel 4 has a vessel main body 11 and a lid 12. The vessel main body 11 has a bottom wall 11a and a peripheral wall 11b, and opens upwards. The lid 12 covers the vessel main body 11 from above to close the opening of the vessel main body 11. That is, the vacuum vessel 4 has the bottom wall 11a and peripheral wall 11b of the vessel main body 11, and the lid 12 as walls. Air tightness is held between the vessel main body 11 and the lid 12 by an O-ring 13.

This vacuum vessel 4 has a treatment chamber 4a for plasma-treating the component 5 to be treated therein. The treatment chamber 4a is defined by the walls disposed in the vacuum vessel 4. In other words, the treatment chamber 4a is defined by inner faces of the bottom wall 11a and peripheral wall 11b of the vessel main body 11 and an inner face of the lid 12.

The vacuum vessel 4 is formed into a strength to such an extent that the inside of the treatment chamber 4a can be decompressed and brought into a vacuum state or the vicinity of the state. As a material forming the vacuum vessel 4, a metal material such as aluminum is usable. In the treatment chamber 4a, as described later, a metal slot plate 14 which is an electromagnetic wave radiation portion is disposed, and a first dielectric component 16 (hereafter simply referred to as dielectric component 16) for covering is disposed to cover the slot plate 14. A support base 17 which supports the component 5 to be treated is disposed in the treatment chamber 4a of the vacuum vessel 4.

The vacuum vessel 4 has a gas introduction port 18 for introducing a process gas into the treatment chamber 4a, and a gas discharge port 19 for discharging the gas from the treatment chamber 4a. The treatment chamber 4a is coupled to a vacuum exhaust system (not shown) via the gas discharge port 19. As the vacuum exhaust system, for example, a turbo molecule pump is usable. Therefore, when the vacuum exhaust system is operated, the treatment chamber 4a can be evacuated until the inside of the chamber reaches a predetermined vacuum degree.

The electromagnetic wave transmission path 3 transmits an electromagnetic wave, and has, for example, one square waveguide 21 for electromagnetic wave distribution, and three square waveguides 22 for electromagnetic wave radiation. A wall defining the treatment chamber 4a among the walls of the vacuum vessel 4, for example, the lid 12 has a part of each of the square waveguides 22 for the electromagnetic wave radiation. That is, a part of the square waveguide 22 for the electromagnetic wave radiation and the wall constituting the vacuum vessel 4 are integrated. In other words, a part of a tubular wall conductor of each square waveguide 22 for the electromagnetic wave radiation also serves as the wall constituting the vacuum vessel 4.

In detail, the inner face of the lid 12 has three groove-like concave portions 23 constituting a part of each of three square waveguides 22 for the electromagnetic wave radiation. These concave portions 23 are covered with the slot plate 14 from a treatment chamber 4a side. In this constitution, three spaces surrounded with the wall faces defining three concave portions 23 and the slot plate 14 constitute three square waveguides 22 for the electromagnetic wave radiation.

The slot plate 14 is formed of a metal plate material, and has a plurality of slots 15a which radiate the electromagnetic wave into the treatment chamber 4a. These slots 15a are formed in positions facing the concave portions 23. In detail, the slots 15a are alternately arranged into a checkered pattern, that is, on a pair of virtual lines extending in parallel with each other to thereby constitute one slot group 15. A pitch of a vertical direction and a pitch of a transverse direction between the slots 15a are uniform in one slot group 15. Three slot groups 15 are disposed facing three concave portions 23 in the slot plate 14.

Moreover, in the treatment chamber 4a, the dielectric component 16 for the covering is disposed to cover the slot plate 14. The dielectric component 16 for the covering can be formed of a dielectric material such as quartz, alumina, and fluorocarbon resin. It is to be noted that to inhibit propagation of the electromagnetic wave in a thickness direction of the dielectric component 16 for the covering, the dielectric component 16 for the covering is preferably set to be smaller than ¼ of a wavelength of the electromagnetic wave in the dielectric component 16 for the covering.

The dielectric component 16 is disposed to thereby cover the exposed surface of the slot plate 14, so that generation of a surface wave plasma is possible. When the dielectric component 16 is not disposed, and the surface of the grounded slot plate 14 is exposed, the propagation of the electromagnetic wave is interrupted, and the surface wave plasma cannot be generated. The surface wave plasma is a localized plasma having high density, and is suitable for the plasma treatment.

As shown in FIGS. 2 and 3, the slot plate 14 and the dielectric component 16 for the covering are screwed/fixed to the lid 12 of the vacuum vessel 4 from an inner face side by male screws 24 which are fixing components. It is to be noted that in a case where the male screws 24 formed of metals are used, when a head of the male screw 24 is exposed to the treatment chamber 4a, the electromagnetic wave is sometimes disturbed in the vicinity of the head of the male screw 24. Therefore, when the male screw 24 formed of the metal is used, the head may be covered with a dielectric cap 25. Consequently, the disturbance of the electromagnetic wave generated in the vicinity of the male screw 24 can be suppressed.

Figure 4:
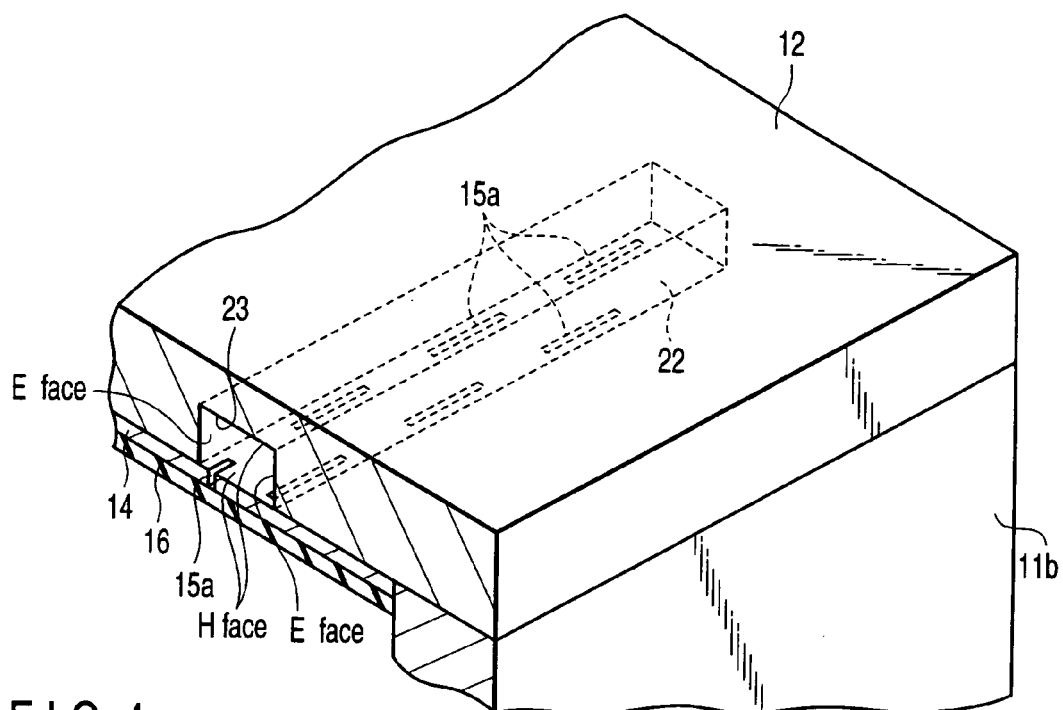
FIG. 4 is a partially cut perspective view of a part of a vacuum vessel of the plasma treatment apparatus of FIG. 1.
Figure 6:
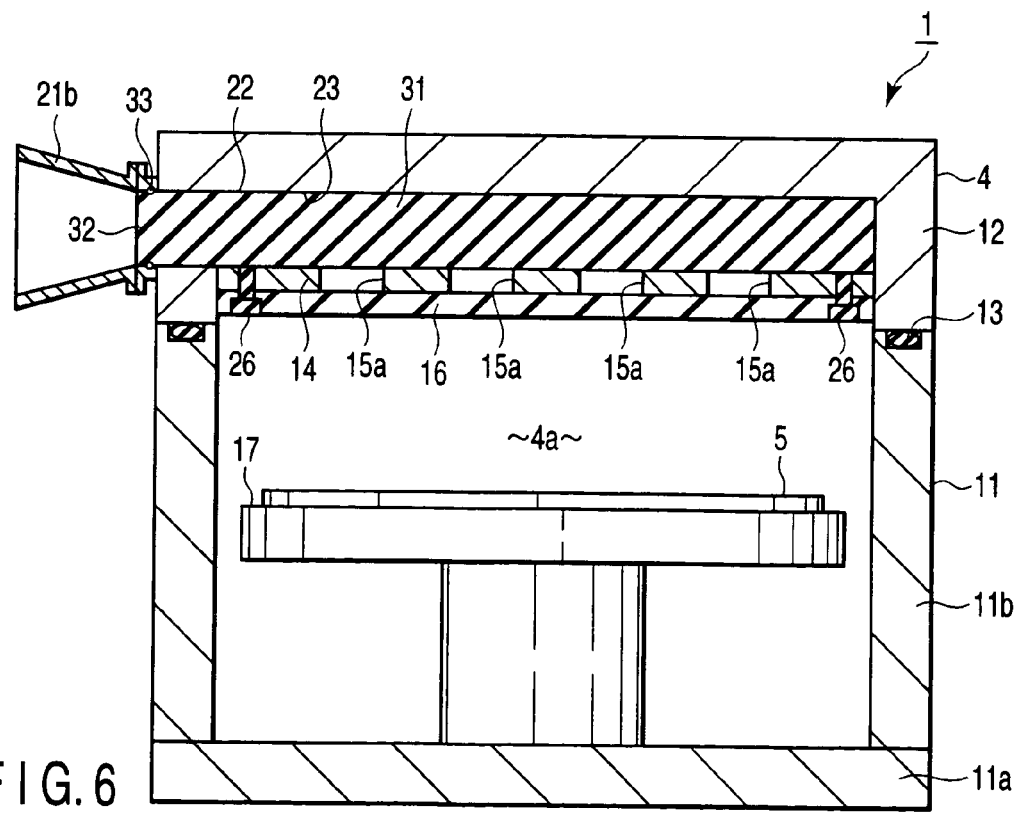
FIG. 6 is a sectional view along line VI-VI in FIG. 5.
Figure 5:
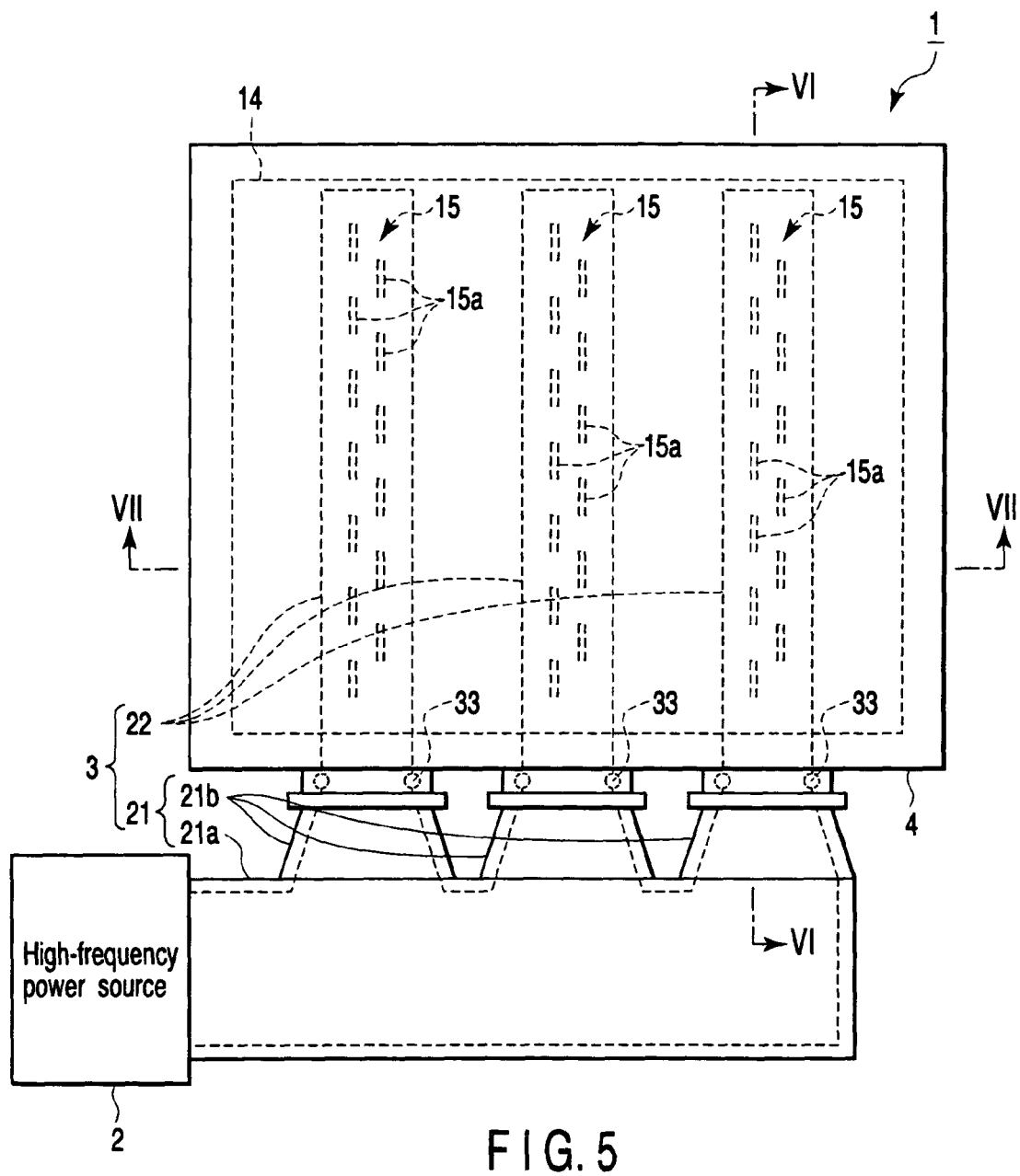
FIG. 5 is a top plan view showing the plasma treatment apparatus according to a second embodiment of the present invention.
Figure 7:
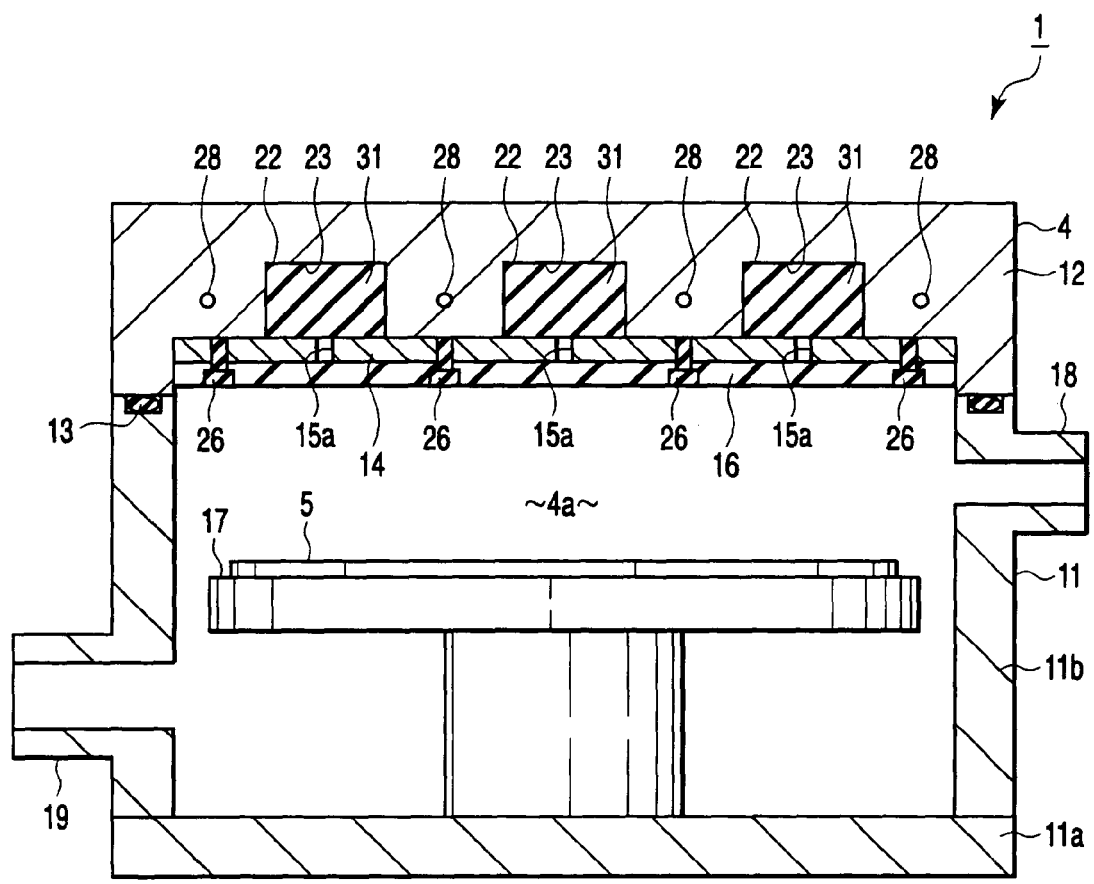
FIG. 7 is a sectional view along line VII-VII in FIG. 5.

As shown in FIG. 4, a sectional shape of each concave portion 23 is a transversely long rectangular shape whose length $x_1$ in a depth direction is shorter than a length $x_2$ in a width direction. That is, in the square waveguide 22 for the electromagnetic wave radiation formed in this manner, the bottom face of the concave portion 23 and the upper face of the slot plate 14 form faces (H faces) vertical to the electric field direction of the electromagnetic wave, and a face rising vertically downwards from the bottom face of the concave portion 23 forms a face (E face) parallel to the electric field direction of the electromagnetic wave. That is, in the present embodiment, the slots 15a are disposed in the H face of each square waveguide 22 for the electromagnetic wave radiation.

It is to be noted that the sectional shape of each concave portion 23 may be a vertically long rectangular shape whose length $x_1$ in the depth direction is longer than the length $x_2$ in the width direction. In the square waveguide 22 for the electromagnetic wave radiation formed in this manner, the bottom face of the concave portion 23 and the upper face of the slot plate 14 form E faces parallel to the electric field direction of the electromagnetic wave, and the face rising vertically downwards from the bottom face of the concave portion 23 is an H face vertical to the electric field direction of the electromagnetic wave. Therefore, the slots 15a are disposed in each E face of the square waveguide 22 for the electromagnetic wave radiation.

An inner sectional dimension of the square waveguide 22 for the electromagnetic wave radiation is set to such a size that the frequency of the electromagnetic wave can be transmitted in the fundamental mode in the square waveguide. In the present embodiment, assuming that an in-tube dielectric constant of the square waveguide 22 for the electromagnetic wave radiation is $\in$, a long diameter of an inner sectional dimension of the square waveguide is $x_2 = a$, and a wavelength of the electromagnetic wave is $\lambda$, the apparatus is designed to satisfy the following condition:

$$(\lambda/\in^{0.5}) < 2a \quad (1).$$

It is to be noted that in the present embodiment the in-tube dielectric constant in the square waveguide 22 for the electromagnetic wave radiation is equal to that of air, and is $\in = 1$.

Moreover, these square waveguides 22 for the electromagnetic wave radiation are arranged in parallel with one another in such a manner that an interval d is 50 cm or less. Concretely, the positions of these square waveguides 22 for the electromagnetic wave radiation are set as follows.

That is, assuming that an angular frequency of the electromagnetic wave emitted from the high-frequency power supply 2 is $\omega$), a dielectric constant of the dielectric component 16 for the covering is $\in_d$, light velocity is c, a charge amount of an electron is e, a dielectric constant of vacuum is $\in_0$, an electron density is $n_e$, and mass of the electron is $m_e$, a plasma angular frequency $\omega_P$ is obtained by:

$$\omega_P = (e^2 \times n_e/(\in_0 \times m_e))^{0.5} \quad (2),$$

and a wave number k is obtained by:

$$k = \omega/c((\in_d(\omega_P^2 - \omega^2))/(\omega_P^2 - (1+\in_d)\omega^2))^{0.5} \quad (3).$$

When the wave number k has the following relation with an inner dimension L of a direction crossing each square waveguide of the vacuum vessel 4 at right angles, an interval d of the square waveguide 22 for the electromagnetic wave radiation is an interval of a wavelength $\lambda_{swp}$ of a standing wave derived by the following:

$$k = m\pi/L \ (m \text{ is an integer of } 1 \leq m \leq 2L/(\lambda/\in^{0.5})) \quad (4); \text{ and}$$

$$\lambda_{swp} = \pi/k \quad (5)$$

The square waveguide 22 for the electromagnetic wave radiation is disposed in a position where the amplitude of the standing wave is substantially maximized.

Each square waveguide 22 for the electromagnetic wave radiation is coupled to the high-frequency power supply 2 via the electromagnetic wave distributing square waveguide 21 for distributing the electromagnetic wave to the square waveguides 22.

As the high-frequency power supply 2, for example, a source for supplying an electromagnetic wave having a frequency of 10 MHz to 25 GHz to the electromagnetic wave transmission path 3 is usable. In the present embodiment, as the high-frequency power supply 2, one microwave source is adopted which supplies an electromagnetic wave having a frequency of 2.45 GHz±50 MHz to the electromagnetic wave transmission path 3. The high-frequency power supply 2 having a frequency of 2.45 GHz is produced in mass. The supply is preferably inexpensive, and has a variety of types.

The square waveguide 21 for the electromagnetic wave distribution is coupled to the lid 12 of the vacuum vessel 4, and is constituted integrally with the wall of the vacuum vessel 4. In detail, the square waveguide 21 for the electromagnetic wave distribution is disposed outside the vacuum vessel 4. The square waveguide 21 for the electromagnetic wave distribution has a tube main body 21a which crosses each square waveguide 22 for the electromagnetic wave radiation at right angles, and three distribution tubular portions 21b bent from the tube main body 21a at right angles in such a manner that the propagation direction of the electromagnetic wave changes by 90°. The electromagnetic wave whose propagation direction has been changed by 90° is distributed to each square waveguide 22 for the electromagnetic wave radiation.

Moreover, a sectional shape of the square waveguide 21 for the electromagnetic wave distribution has a rectangular shape whose length x1 of the depth direction is longer than the length x2 of the width direction. In the present embodiment, the square waveguide 21 for the electromagnetic wave distribution is formed into a size equal to that of the square waveguide 22 for the electromagnetic wave radiation. That is, in the square waveguide 21 for the electromagnetic wave distribution, bottom and upper faces form faces (H faces) vertical to the electric field direction of the electromagnetic wave, and a pair of side faces disposed facing each other form faces (E faces) parallel to the electric field direction of the electromagnetic wave.

Moreover, in the present embodiment, three square waveguides 22 for the electromagnetic wave radiation and the square waveguide 21 for the electromagnetic wave distribution are arranged substantially on the same plane, and the electromagnetic waves are distributed to the respective square waveguides 22 for the electromagnetic wave radiation from the E face of the square waveguide 21 for the electromagnetic wave distribution. It is to be noted that the electromagnetic wave transmission path 3 may be constituted in such a manner that the respective square waveguides 22 for the electromagnetic wave radiation are branched from the H face of the square waveguide 21 for the electromagnetic wave distribution.

The square waveguide 21 for the electromagnetic wave distribution is coupled to each square waveguide 22 for the electromagnetic wave radiation as follows. The concave portions 23 disposed in the lid 12 of the vacuum vessel 4 open in the peripheral face of the lid 12. The square waveguide 21 for the electromagnetic wave distribution is coupled to each square waveguide 21 for the electromagnetic wave distribution via the opening in the peripheral face of the lid 12. The air tightness is held between a tip portion of the square waveguide 21 for the electromagnetic wave distribution and the peripheral face of the lid 12 (outer face of the vacuum vessel 4) by an O-ring 27.

Thus, in the plasma treatment apparatus 1, the electromagnetic wave is supplied to a plurality of (three in the present embodiment) square waveguides 22 for the electromagnetic wave radiation from one high-frequency power supply 2 via the square waveguide 21 for the electromagnetic wave distribution. Therefore, since the frequency can be set to be equal in the whole region of the electromagnetic wave transmission path 3, an antenna (slot plate 14) which radiates uniform energy density is easily designed.

Moreover, a cooling tube 28 which is a cooling mechanism is disposed in a region of the wall of the vacuum vessel 4 facing a portion between the adjacent slots 15a. A cooling liquid which is a refrigerant is circulated in the cooling tube 28. Thus, the electromagnetic wave transmission path 3 (square waveguide 22 for the electromagnetic wave radiation) can be cooled by the refrigerant with good efficiency without disturbing the generation of the plasma.

As described above, according to the plasma treatment apparatus 1, the lid 12 which is the wall of the vacuum vessel 4 has the square waveguide 22 for the electromagnetic wave radiation, which is at least a part of the electromagnetic wave transmission path 3 for transmitting the electromagnetic wave. Therefore, the structure can be simplified, and even the component 5 to be treated, for example, a square substrate or a large-area substrate, can be satisfactorily plasma-treated.

Moreover, according to the plasma treatment apparatus 1, the electromagnetic wave transmission window can be omitted, and sealing portions for holding vacuum of the vacuum vessel 4 may be two places: a connection portion which connects the square waveguide 21 for the electromagnetic wave distribution to the vacuum vessel 4; and a connection portion which connects the lid 12 to the vessel main body 11. Therefore, the structure is simplified as compared with a plasma treatment vessel in which the electromagnetic wave transmission window is disposed in the vacuum vessel 4, and the structure can be manufactured inexpensively.

A second embodiment of the present invention will be described hereinafter with reference to FIGS. 5 to 8.

In a plasma treatment apparatus 1 of the present embodiment, a dielectric component 31 for an electromagnetic wave transmission path is disposed in a region of an electromagnetic wave transmission path 3 positioned in a vacuum vessel 4, that is, a square waveguide 22 for electromagnetic wave radiation. The dielectric component 31 for the electromagnetic wave transmission path can be formed, for example, of quartz, alumina, fluorocarbon resin or the like. In the present embodiment, the dielectric component 31 for the electromagnetic wave transmission path is formed of quartz.

Figure 8A:
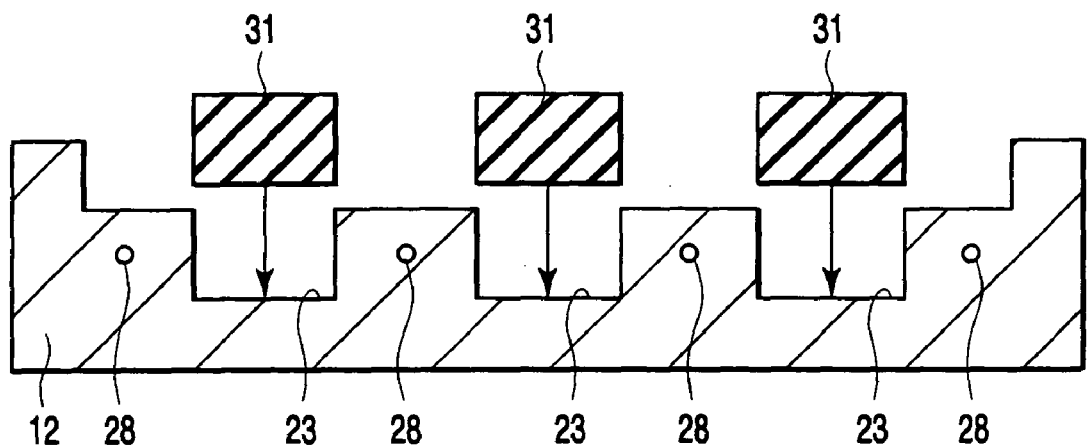
FIG. 8A and FIG. 8B are manufacturing step diagrams showing steps of forming a lid disposed in the plasma treatment apparatus of FIG. 5.
Figure 8B:
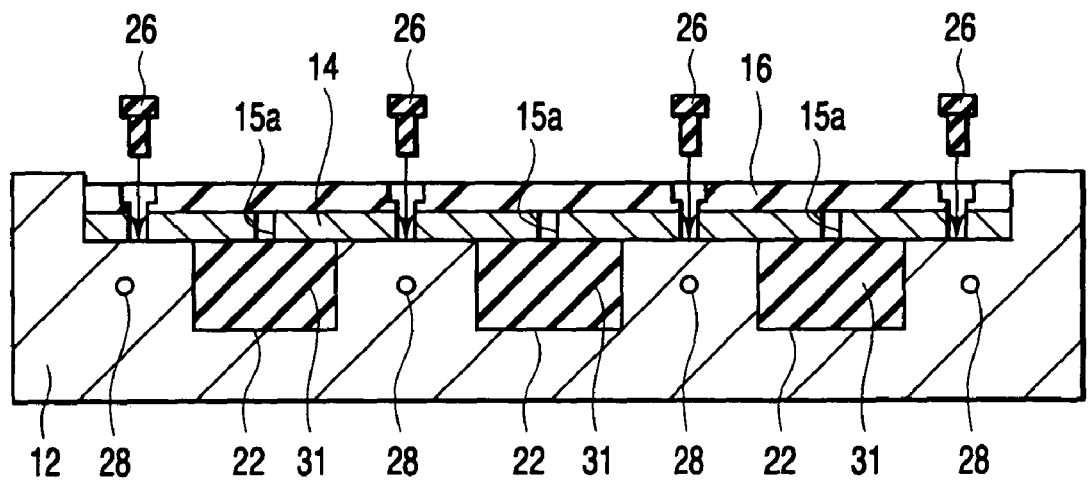

To dispose the dielectric component 31 for electromagnetic wave transmission in the square waveguide 22 for the electromagnetic wave radiation, as shown in FIG. 8A and FIG. 8B, the dielectric components 31 for the electromagnetic wave transmission are formed beforehand, and fitted in the square waveguides 22 for the electromagnetic wave radiation. Thereafter, a slot plate 14 and a dielectric component 16 for covering are stacked on the inner face of a lid 12 in this order, and may be fixed to the lid 12 by fixing components 26. In the present embodiment, the slot plate 14 and the dielectric component 16 for the covering are fixed to the lid 12 of the vacuum vessel 4 by fixing components (e.g., male screws) 26 formed of dielectric materials.

Additionally, to fill the square waveguide 22 for the electromagnetic wave radiation with the dielectric component 31 for the electromagnetic wave transmission, a size (inner sectional dimension) of the square waveguide 22 for the electromagnetic wave radiation needs to be set to a size capable of transmitting the frequency of the electromagnetic wave in a fundamental mode in a square waveguide in the dielectric component 31 for the electromagnetic wave transmission path. In other words, the square waveguide 22 for the electromagnetic wave radiation of the present embodiment needs to have a size obtained by dividing the inner sectional dimension (long and short diameters) of the square waveguide formed into the size capable of transmitting the frequency of the electromagnetic wave in the fundamental mode in the square waveguide in air by a square root of the dielectric constant of the dielectric component 31 in the electromagnetic wave transmission path 3. Concretely, since the dielectric constant ∈ of quartz is about 4, the square waveguide 22 for the electromagnetic wave radiation of the present embodiment needs to have long and short diameters each formed into a length of about ½ of that of the square waveguide formed into the size capable of transmitting the frequency of the electromagnetic wave in the fundamental mode in the square waveguide in the air.

On the other hand, since the square waveguide 21 for the electromagnetic wave distribution is filled with air, the tube main body 21a of the square waveguide 21 for the electromagnetic wave distribution needs to be set to a size (equal to that of the tube main body 21a of the first embodiment) capable of transmitting the frequency of the electromagnetic wave in the fundamental mode in the square waveguide in air. Therefore, in the plasma treatment apparatus 1 of the present embodiment, three distribution tubular portions 21b are tapered, and accordingly the square waveguide 21 for the electromagnetic wave distribution is coupled to the square waveguide 22 for the electromagnetic wave radiation. Moreover, in the plasma treatment apparatus 1, a second dielectric component 32 (hereafter simply referred to as dielectric component 32) for holding the vacuum vessel 4 in an airtight manner is disposed in the electromagnetic wave transmission path 3, for example, in the distribution tubular portions 21b of the square waveguide 21 for the electromagnetic wave distribution. The air tightness of the vacuum vessel 4 is kept by this dielectric component 32. It is to be noted that the dielectric component 32 for holding the vacuum vessel 4 in the airtight manner may be disposed anywhere in the electromagnetic wave transmission path 3, for example, in the square waveguide 22 for the electromagnetic wave radiation. In this case, the dielectric component 31 may perform this function.

An interval between the square waveguide 21 for the electromagnetic wave distribution and the dielectric component 32 for holding the vacuum vessel 4 in the airtight manner is set to 1 mm. The air tightness is held between the inner face of the square waveguide 21 for the electromagnetic wave distribution and the dielectric component 32 for holding the vacuum vessel 4 in the airtight manner by O rings 33. The electromagnetic wave is introduced into the vacuum vessel 4 from the outside of the vacuum vessel 4 through the dielectric component 32 for holding the vacuum vessel 4 in the airtight manner. It is to be noted that in the present embodiment, the dielectric component 32 for holding the vacuum vessel 4 in the airtight manner is molded integrally with the dielectric component 31 in the electromagnetic wave transmission path 3. The dielectric component 32 for holding the vacuum vessel 4 in the airtight manner may be separate from the dielectric component 31 in the electromagnetic wave transmission path 3. Since the other constitution is the same as that of the first embodiment including a portion (not shown), the constitution is denoted with the same reference numerals in the drawing, and the redundant description is omitted.

When this plasma treatment apparatus 1 is used, the component 5 to be treated can be plasma-oxidized, for example, under a surface wave plasma condition. When this plasma treatment apparatus 1 is used, for example, a film can be plasma-formed on the component 5 to be treated under the surface wave plasma condition. Furthermore, when this plasma treatment apparatus 1 is used, the component 5 to be treated can be plasma-etched under the surface wave plasma condition. When this plasma treatment apparatus 1 is used, plasma oxidation and film forming by a plasma CVD process can be performed continuously without breaking vacuum. A plasma treatment method for performing the plasma oxidation and the film forming by the plasma CVD process without breaking the vacuum will be described as one example of the plasma treatment method of the component 5 to be treated.

As the component 5 to be treated, for example, a silicon substrate is prepared. The component 5 to be treated is disposed on the support base 17 in the vacuum vessel 4. A vacuum exhaust system is operated, and air in the vacuum vessel 4 (treatment chamber 4a) is discharged. Thereafter, a first gas is supplied into the vacuum vessel 4 via the gas introduction port 18. As the first gas, for example, oxygen gas, or a mixture gas of oxygen with a rare gas containing at least one of helium, neon, argon, krypton, and xenon is used. In the present embodiment, the oxygen gas is adopted as the first gas, and this gas is supplied into the vacuum vessel 4 in such a manner that 400 SCCM of the oxygen gas is used, and a total pressure is 20 Pa.

When the gas pressure in the vacuum vessel 4 reaches a predetermined gas pressure, irradiation with the electromagnetic wave is started. The electromagnetic wave sent to the slots 15a via the electromagnetic wave transmission path 3 is radiated into the vacuum vessel 4 via the respective slots 15a.

The electromagnetic wave radiated into the vacuum vessel 4 excites the oxygen gas which is the first gas. When electron density in the plasma in the vicinity of the dielectric component 16 for the covering increases to a certain degree, the electromagnetic wave cannot propagate in the plasma, and decays in the plasma. Therefore, any electromagnetic wave does not reach a region distant from the dielectric component 16 for the covering, and a surface wave plasma is generated in the vicinity of the dielectric component 16 for the covering.

In a state in which the surface wave plasma is generated, high electron density is achieved in the vicinity of the dielectric component 16 for the covering, and accordingly high-density oxygen atom active species are generated. The high-density oxygen atom active species diffuse to the component 5 to be treated, and efficiently oxidize the component 5 to be treated. Accordingly, a first insulating film is formed on the surface of the component 5 to be treated. It is to be noted that in a state in which the surface wave plasma is generated, electron temperature in the vicinity of the surface of the component 5 to be treated is low (electron energy is low), and therefore an electric field of a sheath in the vicinity of the surface of the component 5 to be treated is also weak. Therefore, since incidence energy of ions into the component 5 to be treated is reduced, ion damages on the component 5 to be treated during an oxidation process are suppressed.

Furthermore, a second gas is supplied into the vacuum vessel 4 from the gas introduction port 18. As the second gas, for example, a gas containing an organic silicon compound (tetra alkoxysilane, vinyl alkoxysilane, alkyl trialkoxysilane, phenyl trialkoxysilane, polymethyl disiloxane, polymethyl cyclotetrasiloxane, etc.) or an organic metal compound (trimethyl aluminum, triethyl aluminum, tetra propoxyzirconium, pentaethoxy tantalum, tetra propoxy hafnium, etc.) is usable. In the present embodiment, the oxygen gas is subsequently used as the first gas, and a tetra ethoxysilane gas which is one type of tetra alkoxysilane is used as the second gas. Moreover, these gases are supplied into the vacuum vessel 4 in such a manner that 400 SCCM of the oxygen gas is used as the first gas, 10 SCCM of the tetra ethoxysilane gas is used as the second gas, and a total pressure is 20 Pa.

An oxygen radical generated from the first gas reacts with tetra ethoxysilane which is the second gas. Accordingly, decomposition of tetra ethoxysilane is promoted, and silicon oxide is deposited on the surface of the component 5 to be treated. Accordingly, a second insulating film (silicon oxide film formed by CVD) is formed on a first insulating film. As described above, the forming of the insulating film on the component 5 to be treated is completed. According to the plasma treatment method, after subjecting the component 5 to be treated to an oxidation process, the film can be formed without being exposed to the atmosphere. Therefore, the interface between the component to be treated and the film can be formed into a satisfactory interface having little contamination, and a satisfactory-quality CVD film can be formed on the component 5 to be treated.

As described above, according to the plasma treatment apparatus 1, the lid 12 which is the wall of the vacuum vessel 4 has the square waveguide 22 for the electromagnetic wave radiation which is at least a part of the electromagnetic wave transmission path 3 for transmitting the electromagnetic wave in the same manner as in the first embodiment. Therefore, a structure can be simplified, and even the component 5 to be treated, for example, a square substrate or a large-area substrate, can be satisfactorily plasma-treated.

Moreover, according to the plasma treatment apparatus 1, the electromagnetic wave transmission window can be omitted, and sealing portions for holding vacuum of the vacuum vessel 4 may be two places: a connection portion which connects the square waveguide 21 for the electromagnetic wave distribution to the vacuum vessel 4; and a connection portion which connects the lid 12 to the vessel main body 11. Therefore, the structure can be simplified as compared with a conventional plasma treatment vessel in which the electromagnetic wave transmission window is disposed in the vacuum vessel 4, and the structure can be manufactured inexpensively.

Furthermore, according to the plasma treatment apparatus 1 of the present embodiment, the component 5 to be treated can be plasma-treated by the surface wave plasma. Since the square waveguide 22 for the electromagnetic wave radiation has the dielectric component 31 for the electromagnetic wave transmission, the invasion of the plasma generated in the vacuum vessel 4 into the electromagnetic wave transmission path 3 can be inhibited.

Figure 9:
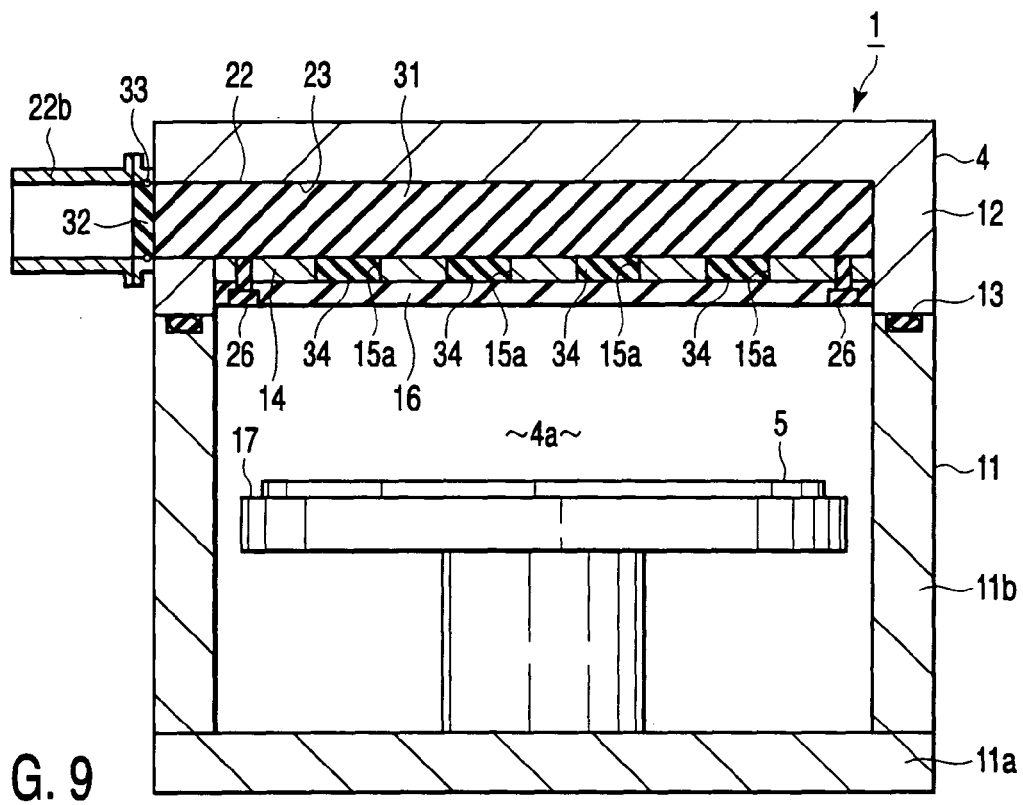
FIG. 9 is a sectional view of the plasma treatment apparatus according to a third embodiment of the present invention along a direction of a square waveguide for electromagnetic wave radiation.
Figure 10:
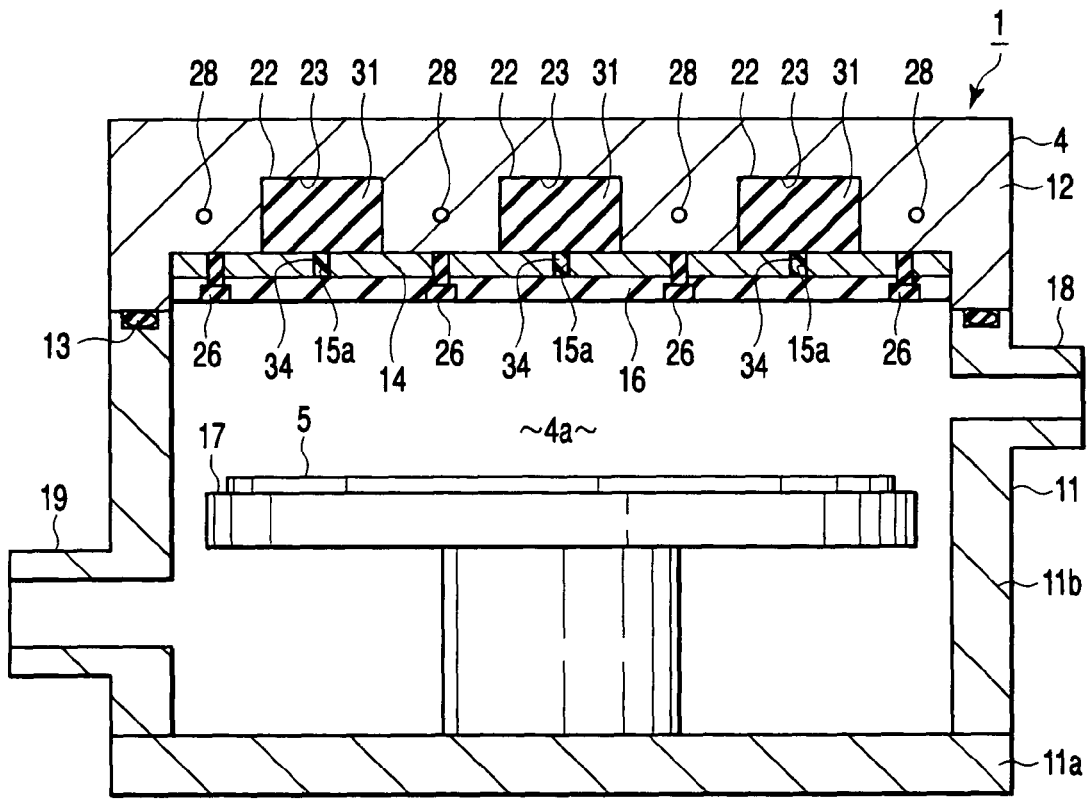
FIG. 10 is a sectional view of the plasma treatment apparatus of FIG. 9 along a direction crossing the square waveguide for the electromagnetic wave radiation.

A third embodiment of the present invention will be described hereinafter with reference to FIGS. 9 and 10.

In a plasma treatment apparatus 1 of the present embodiment, a dielectric component 31 for an electromagnetic wave transmission path is disposed in a region of an electromagnetic wave transmission path 3 positioned in a vacuum vessel 4, that is, a square waveguide 22 for electromagnetic wave radiation. The dielectric component 31 for the electromagnetic wave transmission path can be formed, for example, of quartz, alumina, fluorocarbon resin or the like. In the present embodiment, the dielectric component 31 for the electromagnetic wave transmission path is formed of fluorocarbon resin. The fluorocarbon resin is lighter (specific weight is smaller) than quartz. Therefore, when the dielectric component 31 for the electromagnetic wave transmission path is formed of fluorocarbon resin, the plasma treatment apparatus 1 can be lightened.

Additionally, in the present embodiment, each square waveguide 22 for the electromagnetic wave radiation is filled with fluorocarbon resin. Since dielectric constant of the fluorocarbon resin is smaller than that of quartz, a size of the square waveguide 22 for the electromagnetic wave radiation does not have to be reduced as in the second embodiment. Therefore, in the present embodiment, an inner sectional dimension of the square waveguide 22 for the electromagnetic wave radiation is set to be equal to that of a square waveguide 21 for electromagnetic wave distribution.

Furthermore, a dielectric component 34 is disposed in each slot 15a in order to inhibit reflection of the electromagnetic wave in an interface between each square waveguide 22 for the electromagnetic wave radiation and the slot 15a and an interface between each slot 15a and a dielectric component 16. The dielectric component 34 can be formed, for example, of quartz, alumina, fluorocarbon resin or the like. In the present embodiment, the dielectric component 34 is formed of fluorocarbon resin. It is to be noted that in a case where the dielectric component 16 for covering is formed of quartz, slight reflection of the electromagnetic wave occurs in the interface between the slots 15a and the dielectric component 16. However, when the dielectric components 34 for the slots are arranged, the reflection in the interface between the slots 15a and the dielectric component 16 can be reduced as compared with a case where the dielectric components 34 for the slots are omitted (a state in which the slots 15a are filled with air).

To dispose the dielectric component 31 in the square waveguide 22 for the electromagnetic wave radiation, in the same manner as in the second embodiment, the dielectric components 31 are formed beforehand, and fitted in the square waveguides 22 for the electromagnetic wave radiation. Thereafter, a slot plate 14 constituted by fitting the dielectric components 34 into the slots 15a, and the dielectric component 16 for the covering are stacked on the inner face of a lid 12 in this order, and may be fixed to the lid 12 by fixing components 26. In the present embodiment, the slot plate 14 and the dielectric component 16 for covering are fixed to the lid 12 of the vacuum vessel 4 by the fixing components 26 formed of dielectric materials.

It is to be noted that the dielectric components 31 in the electromagnetic wave transmission path 3 may be assembled integrally with the dielectric components 34 in the slots. In this case, a trouble of filling the slots 15a with the dielectric components 34 one by one can be saved. The dielectric components 31 in the electromagnetic wave transmission path 3, the dielectric components 34 in the slots, and the dielectric component 16 for the covering may be integrally assembled.

Moreover, in the plasma treatment apparatus 1, a dielectric component 32 for holding the vacuum vessel 4 in an airtight manner is disposed separately from the dielectric component 31 for the electromagnetic wave transmission path in the electromagnetic wave transmission path 3, for example, in a distribution tubular portion 21b of the square waveguide 21 for the electromagnetic wave distribution. The air tightness of the vacuum vessel 4 is kept by this dielectric component 32. The dielectric component 32 may be formed, for example, of quartz, fluorocarbon resin, alumina or the like. The air tightness is held between the inner face of the square waveguide 21 for the electromagnetic wave distribution and the dielectric component 32 for holding the vacuum vessel 4 in the airtight manner by O rings 33.

It is to be noted that even when the plasma treatment apparatus 1 of the present embodiment is used, a plasma treatment method can be realized using a surface wave plasma as described in the second embodiment. Since the other constitution is the same as that of the second embodiment including a part (not shown), the constitution is denoted with the same reference numerals, and redundant description is omitted.

As described above, according to the plasma treatment apparatus 1, the lid 12 which is the wall of the vacuum vessel 4 has the square waveguide 22 for the electromagnetic wave radiation which is at least a part of the electromagnetic wave transmission path 3 which transmits the electromagnetic wave in the same manner as in the first embodiment. Therefore, a structure can be simplified, and even a component 5 to be treated such as a square substrate and a large-area substrate can be satisfactorily plasma-treated.

Moreover, according to the plasma treatment apparatus 1, the electromagnetic wave transmission window can be omitted, and sealing portions for holding vacuum of the vacuum vessel 4 may be two places: a connection portion which connects the square waveguide 21 for the electromagnetic wave distribution to the vacuum vessel 4; and a connection portion which connects the lid 12 to the vessel main body 11. Therefore, the structure can be simplified as compared with a conventional plasma treatment vessel in which the electromagnetic wave transmission window is disposed in the vacuum vessel 4, and the structure can be manufactured inexpensively.

Furthermore, according to the plasma treatment apparatus 1 of the present embodiment, the component 5 to be treated can be plasma-treated by the surface wave plasma.

Moreover, since the dielectric components 34 are disposed in the slots 15a, reflection of the electromagnetic wave in the interface between the square waveguides 22 for the electromagnetic wave radiation and the slots 15a, and in the interface between the slots 15a and the dielectric component 16 for the covering can be inhibited.

It is to be noted that dielectric materials forming the dielectric components 31 in the electromagnetic wave transmission path 3, the dielectric components 34 in the slots, the dielectric component 16 for the covering, and the dielectric component 32 for holding the vacuum vessel 4 as the treatment vessel in the airtight manner are not limited to quartz, fluorocarbon resin, alumina and the like, and various dielectric materials are usable.

For example, porous materials may be used as the dielectric materials. Examples of the porous material include an inorganic porous material having a large number of micro holes therein, such as porous glass and porous ceramic, and an organic porous material having a large number of micro holes in organic resins such as acrylic resin, epoxy resin, and fluorocarbon resin. Since the porous material has a certain degree of flexibility with respect to compression or pulling from the outside, the material is suitable as a material for filling without any gap. Furthermore, weight saving of the apparatus is enabled because density of the porous materials is small. The dielectric constant is low as compared with a usual dielectric material, there is little change of a refractive index from the atmosphere into the porous material or from the porous material into vacuum, and the material has a satisfactory electromagnetic wave propagation characteristic.

A fourth embodiment of the present invention will be described hereinafter with reference to FIGS. 14 to 18.

In a plasma treatment apparatus 101 of the present embodiment, a plasma is generated in a vacuum vessel 4 by an electromagnetic wave oscillated by a high-frequency power supply 2 which is an oscillator, transmitted by an electromagnetic wave transmission mechanism 103, and radiated into the vacuum vessel 4 which is a treatment vessel by slots 15a disposed in a slot plate 14 which is an electromagnetic wave radiation portion. A component 5 to be treated is plasma-treated by the plasma.

Figure 15:
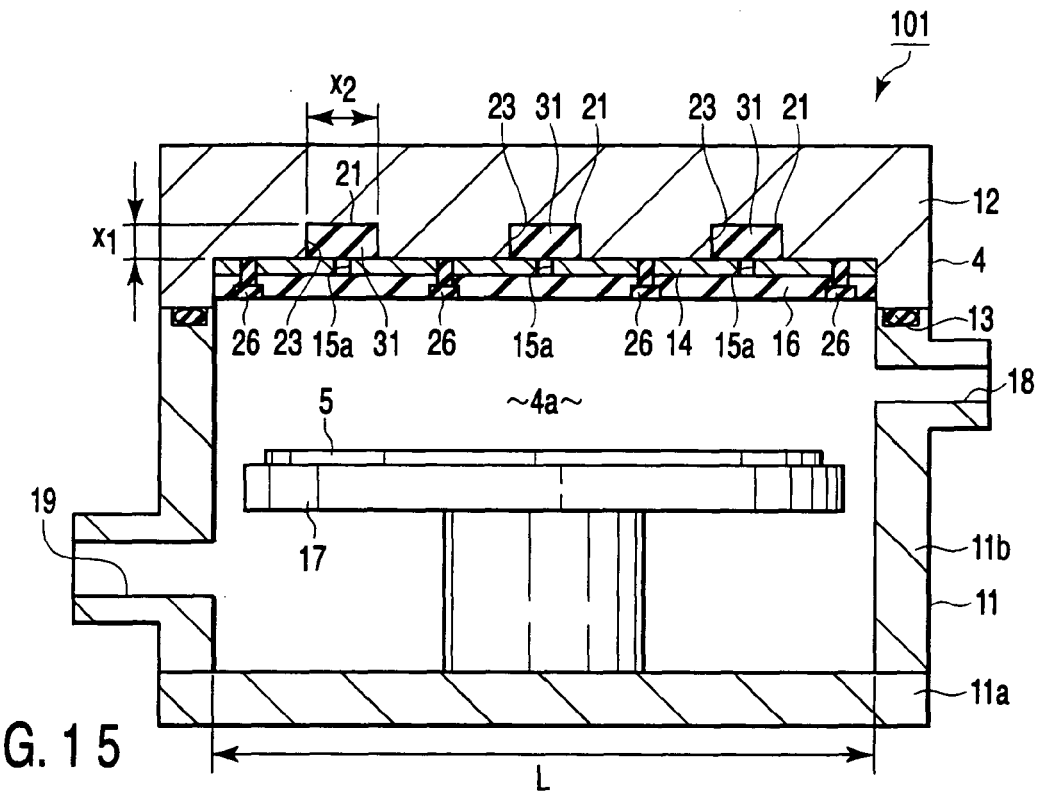
FIG. 15 is a sectional view of the plasma treatment apparatus of FIG. 14 along a direction crossing a rectangular waveguide for the electromagnetic wave radiation.
Figure 16:
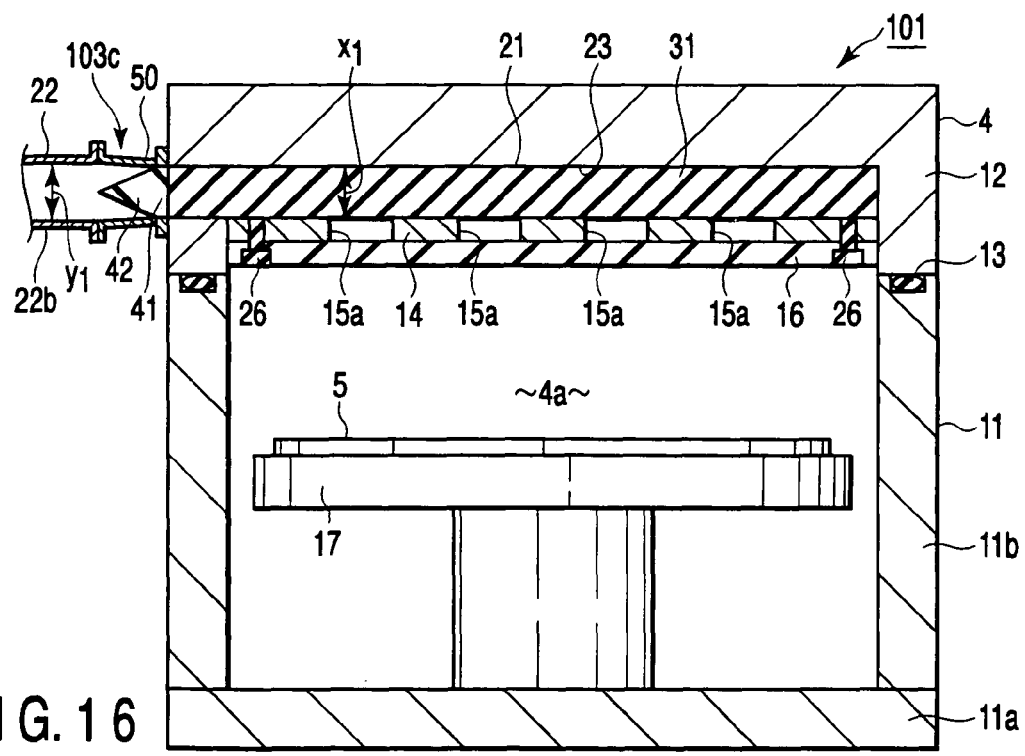
FIG. 16 is a sectional view of the plasma treatment apparatus of FIG. 14 along a direction of the rectangular waveguide for the electromagnetic wave radiation.

As shown in FIGS. 15 and 16, the vacuum vessel 4 has a vessel main body 11 and a lid 12. The vessel main body 11 has a bottom wall 11a and a peripheral wall 11b, and opens upwards. The lid 12 covers the vessel main body 11 from above to close the opening of the vessel main body 11. That is, the vacuum vessel 4 has the bottom wall 11a and peripheral wall 11b of the vessel main body 11, and the lid 12 as walls. Air tightness is held between the vessel main body 11 and the lid 12 by an O-ring 13.

This vacuum vessel 4 has a treatment chamber 4a for plasma-treating the component 5 to be treated therein. The treatment chamber 4a is defined by the walls disposed in the vacuum vessel 4. In other words, the treatment chamber 4a is defined by inner faces of the bottom wall 11a and peripheral wall 11b of the vessel main body 11 and an inner face of the lid 12.

The vacuum vessel 4 is formed into a strength to such an extent that the inside of the treatment chamber 4a can be decompressed and brought into a vacuum state or the vicinity of the state. As a material forming the vacuum vessel 4, a metal material such as aluminum is usable. In the treatment chamber 4a, as described later, a metal slot plate 14 which is an electromagnetic wave radiation portion is disposed, and a dielectric component 16 for covering is disposed to cover the slot plate 14. A support base 17 which supports the component 5 to be treated is disposed in the treatment chamber 4a of the vacuum vessel 4.

The vacuum vessel 4 has a gas introduction port 18 for introducing a process gas into the treatment chamber 4a, and a gas discharge port 19 for discharging the gas from the treatment chamber 4a. The treatment chamber 4a is coupled to a vacuum exhaust system (not shown) via the gas discharge port 19. As the vacuum exhaust system, for example, a turbo molecule pump is usable. Therefore, when the vacuum exhaust system is operated, the treatment chamber 4a can be evacuated until the inside of the chamber reaches a predetermined vacuum degree.

The electromagnetic wave transmission mechanism 103, for transmitting electromagnetic wave, has first electromagnetic wave transmission path 103a, second electromagnetic wave transmission path 103b, and at least one, for example, three third electromagnetic wave transmission paths 103c which connect between the first electromagnetic wave transmission path 103a and the second electromagnetic wave transmission path 103b. Hereinafter, the rectangular waveguide 21 is referred to as a rectangular waveguide for electromagnetic wave distribution.

The rectangular waveguide 21 for electromagnetic wave distribution is coupled with lid 12 of vacuum vessel 4 and the wall constituting the vacuum vessel 4 are integrated. The second electromagnetic wave transmission path 103b has at least one, for example, three rectangular waveguides 22. Hereinafter, the rectangular waveguide 22 is referred to as a rectangular waveguide for the electromagnetic wave radiation.

The rectangular waveguide 22 for electromagnetic radiation, the slot plate 14, and dielectric component 16 for the covering are explained here.

A wall defining the treatment chamber 4a among the walls of the vacuum vessel 4, for example, the lid 12 has a part of each of the square waveguides 22 for the electromagnetic wave radiation. That is, a part of the square waveguide 22 for the electromagnetic wave radiation and the wall constituting the vacuum vessel 4 are integrated. In other words, a part of a tubular wall conductor of each square waveguide 22 for the electromagnetic wave radiation also serves as the wall constituting the vacuum vessel 4.

In detail, the inner face of the lid 12 has three groove-like concave portions 23 constituting a part of each of three square waveguides 22 for the electromagnetic wave radiation. These concave portions 23 are covered with the slot plate 14 from a treatment chamber 4a side. In this constitution, three spaces surrounded with the wall faces defining three concave portions 23 and the slot plate 14 constitute three square waveguides 22 for the electromagnetic wave radiation.

The slot plate 14 is formed of a metal plate material, and has a plurality of slots 15a which radiate the electromagnetic wave into the treatment chamber 4a. These slots 15a are formed in positions facing the concave portions 23. In detail, the slots 15a are alternately arranged into a checkered pattern, that is, on a pair of virtual lines extending in parallel with each other to thereby constitute one slot group 15. A pitch of a vertical direction and a pitch of a transverse direction between the slots 15a are uniform in one slot group 15. Three slot groups 15 are disposed facing three concave portions 23 in the slot plate 14.

Moreover, in the treatment chamber 4a, the dielectric component 16 for the covering is disposed as to cover the slot plate 14. The dielectric component 16 for the covering can be formed of a dielectric material such as quartz, alumina, and fluorocarbon resin. It is to be noted that to inhibit propagation of the electromagnetic wave in a thickness direction of the dielectric component 16 for the covering, the dielectric component 16 for the covering is preferably set to be smaller than ¼ of a wavelength of the electromagnetic wave in the dielectric component 16 for the covering.

In order to inhibit reflection in interfaces between rectangular waveguides 22 for electromagnetic wave radiation and slots 15a, and in an interface between the slots 15a and a dielectric component 16 for covering, dielectric components are preferably disposed in the slots 15a. The dielectric component in the slot may be formed, for example, of quartz, alumina, fluorocarbon resin or the like.

As shown in FIGS. 15 and 16, the slot plate 14 and the dielectric component 16 for the covering are screwed/fixed to a lid 12 of a vacuum vessel 4 from an inner face side by male screws which are fixing components 26. It is to be noted that the fixing components 26 formed of dielectric materials are preferably used. In a case where the fixing components 26 formed of metals are used, when the fixing components 26 are exposed in a treatment chamber 4a, the electromagnetic wave is sometimes disturbed in the vicinity of exposed portions of the fixing components 26. Therefore, when the fixing components 26 formed of the metals are used, the exposed portions may be covered with caps formed of dielectric materials. Consequently, the disturbance of the electromagnetic wave generated in the vicinity of exposed portions of the fixing components 26 can be suppressed.

Additionally, an interval (see FIG. 14) d of the rectangular waveguide 22 for the electromagnetic wave radiation is preferably set in consideration of a diffusion degree of the plasma. That is, the lower the pressure of a process gas is, the farther the particle diffuses. In the plasma treatment apparatus, the pressure of the process is generally set to approximately 1 Pa or more. When the pressure of the process gas is 1 Pa or more, an upper limit is set to 50 cm, and an interval (pitch) d of the rectangular waveguide 22 for the electromagnetic wave radiation is preferably set in accordance with the assumed pressure of the process gas. Then a uniform plasma can be generated in the treatment chamber even on a condition on which the plasma does not easily diffuse. It is to be noted that when the pressure of the process gas is 0.1 Pa or less, the plasma easily diffuses, and the interval d of the rectangular waveguide 22 for the electromagnetic wave radiation may exceed 50 cm.

The rectangular waveguides 22 for the electromagnetic wave radiation are arranged in parallel with one another in such a manner that the interval d is 50 cm or less. Furthermore, concretely, the positions of the rectangular waveguides 22 for the electromagnetic wave radiation may be set as shown in the above equations (2) to (5).

To inhibit invasion of the plasma from the slots 15a into a second electromagnetic wave transmission path 103b, all regions in the respective rectangular waveguides 22 for the electromagnetic wave radiation are filled with dielectric components 31 for the electromagnetic wave transmission path. The dielectric components 31 disposed in the rectangular waveguides 22 for the electromagnetic wave radiation can be formed of dielectric materials such as quartz, alumina, and fluorocarbon resin. In the present embodiment, the dielectric component 31 is formed of quartz. It is to be noted that the dielectric component 31 may be disposed only in a part of the second electromagnetic wave transmission path 103b.

The dielectric components 31 can be disposed in the rectangular waveguides 22 for the electromagnetic wave radiation, for example, as follows. First, square pole shaped elongate dielectric components 31 are formed beforehand. The respective dielectric components 31 are fitted in the concave portions 23. Thereafter, the slot plate 14 and the dielectric component 16 for the covering are stacked on the inner face of the lid 12 in this order, and they are fixed to the lid 12 via the fixing components 26. Accordingly, the dielectric components 31 are stored in the rectangular waveguides 22 for the electromagnetic wave radiation.

For example, as shown in FIG. 15, an inner shape (sectional shape) of each rectangular waveguide 22 for the electromagnetic wave radiation forms a transversely long rectangular shape whose length $x_1$ in a depth direction is shorter than a length $x_2$ in a width direction. That is, in the rectangular waveguide 22 for the electromagnetic wave radiation formed in this manner, the bottom face of a concave portion 23 and the upper face of the slot plate 14 form faces (H faces) vertical to the electric field direction of the electromagnetic wave, and a face rising vertically downwards from the bottom face of the concave portion 23 forms a face (E face) parallel to the electric field direction of the electromagnetic wave. That is, in the plasma treatment apparatus 101 of the present embodiment, the slots 15a are disposed in the regions of the rectangular waveguides 22 for the electromagnetic wave radiation facing the H face.

It is to be noted that an inner shape (sectional shape) of each rectangular waveguide 22 for the electromagnetic wave radiation may be a vertically long rectangular shape whose length $x_1$ in the depth direction is longer than the length $x_2$ in the width direction. In the rectangular waveguide 22 for the electromagnetic wave radiation formed in this manner, the bottom face of the concave portion 23 and the upper face of the slot plate 14 form E faces parallel to the electric field direction of the electromagnetic wave, and the face rising vertically downwards from the bottom face of the concave portion 23 is an H face vertical to the electric field direction of the electromagnetic wave. Therefore, a plasma treatment apparatus can be obtained in which the slots 15a are disposed in regions of the respective rectangular waveguides 22 for the electromagnetic wave radiation facing the E face.

Next, a rectangular waveguide 21 for electromagnetic wave distribution will be described.

The rectangular waveguide 21 for the electromagnetic wave distribution is disposed outside the vacuum vessel 4. The rectangular waveguide 21 for the electromagnetic wave distribution has a tube main body 21a which crosses each rectangular waveguide 22 for the electromagnetic wave radiation at right angles, and three distribution tubular portions 21b bent from the tube main body 21a at right angles in such a manner that the propagation direction of the electromagnetic wave changes by 90°. The electromagnetic wave whose propagation direction has been changed by 90° is distributed to each rectangular waveguide 22 for the electromagnetic wave radiation. It is to be noted that a flange 21c is disposed on a tip portion (end portion on the transmission side of the electromagnetic wave) of each distribution tubular portion 21b (see FIG. 17).

Moreover, an inner shape (sectional shape) of the rectangular waveguide 21 for the electromagnetic wave distribution has a rectangular shape whose length $y_1$ of the depth direction is shorter than a length $y_2$ of the width direction. Therefore, in the rectangular waveguide 21 for the electromagnetic wave distribution, bottom and upper faces form faces (H faces) vertical to the electric field direction of the electromagnetic wave, and a pair of side faces disposed facing each other form faces (E faces) parallel to the electric field direction of the electromagnetic wave.

It is to be noted that an inner shape (sectional shape) of the rectangular waveguide 22 for the electromagnetic wave radiation has a vertically long rectangular shape whose length $x_1$ of the depth direction is longer than a length $x_2$ of the width direction. In this case, an inner shape (sectional shape) of the rectangular waveguide 21 for the electromagnetic wave distribution preferably has a vertically long rectangular shape whose length $y_1$ of the depth direction is longer than the length $y_2$ of the width direction. In the rectangular waveguide 21 for the electromagnetic wave distribution, formed in this manner, the bottom and upper faces form E faces parallel to the electric field direction of the electromagnetic wave, and a pair of side faces disposed facing each other form H faces vertical to the electric field direction of the electromagnetic wave.

The electromagnetic wave transmission mechanism 103 is constituted in such a manner that a central axis line of the rectangular waveguide 21 for the electromagnetic wave distribution is positioned substantially on the same plane as that on which central axial lines of three rectangular waveguides 22 for the electromagnetic wave radiation are positioned. Moreover, the electromagnetic wave is distributed to the rectangular waveguides 22 for the electromagnetic wave radiation from the E face of the rectangular waveguide 21 for the electromagnetic wave distribution. It is to be noted that in the electromagnetic wave transmission mechanism 103, each rectangular waveguide 22 for the electromagnetic wave radiation may be branched from the H face of the rectangular waveguide 21 for the electromagnetic wave distribution.

Furthermore, in the electromagnetic wave transmission mechanism 103, each of an inner dimension of the rectangular waveguide 21 for the electromagnetic wave distribution, and that of the rectangular waveguide 22 for the electromagnetic wave radiation is set to a size in which the only fundamental mode in the rectangular waveguide is transmitted. Each of the inner dimensions of the rectangular waveguide 21 for the electromagnetic wave distribution and the rectangular waveguide 22 for the electromagnetic wave radiation is set to be a size in which the only fundamental mode in the rectangular waveguide is transmitted. Accordingly, the propagation loss amount of the electromagnetic wave for generating the plasma in the electromagnetic wave transmission mechanism 103 can be reduced.

Additionally, to set the size by which the only fundamental mode in the rectangular waveguide is transmitted, assuming that an in-tube dielectric constant of a rectangular waveguide is ∈, a long diameter of an inner sectional dimension of the rectangular waveguide is a, and a wavelength of the electromagnetic wave is λ, the size can be realized by designing the apparatus to satisfy the following condition:

$$(\lambda/\in^{0.5})<2a \qquad (1).$$

As described above, the rectangular waveguide 21 for the electromagnetic wave distribution is filled with air (∈=1), and the rectangular waveguide 22 for the electromagnetic wave radiation is filled with the dielectric component 31 (quartz, ∈=3.8).

Therefore, the inner dimension (short diameter $x_1$ and long diameter $x_2$) of the rectangular waveguide 22 for the electromagnetic wave radiation needs to have a size obtained by dividing the inner dimension (long diameter $y_1$ and short diameter $y_2$) of the rectangular waveguide 21 for the electromagnetic wave distribution by a square root of the dielectric constant ∈ of the dielectric component 31. Concretely, since the dielectric constant ∈ of quartz is about 4, the short diameter $x_1$ and the long diameter $x_2$ of the rectangular waveguide 22 for the electromagnetic wave radiation need to be about ½ of the long diameter $y_1$ and the short diameter $y_2$ of the rectangular waveguide 21 for the electromagnetic wave distribution, respectively.

Therefore, in the plasma treatment apparatus 101, the rectangular waveguide 21 for the electromagnetic wave distribution is coupled to the rectangular waveguide 22 for the electromagnetic wave radiation via a hollow third electromagnetic wave transfer path 103c formed in such a manner that an inner dimension is reduced toward the transmission side of the electromagnetic wave. In the present embodiment, as shown in FIG. 14, each distribution tubular portion 21b of the rectangular waveguide 21 for the electromagnetic wave distribution is coupled to the rectangular waveguide 22 for the electromagnetic wave radiation via the third electromagnetic wave transfer path 103c having connection components 50.

A mechanism for connecting each distribution tubular portion 21b of the rectangular waveguide 21 for the electromagnetic wave distribution to the rectangular waveguide 22 for the electromagnetic wave radiation will be described hereinafter with reference to FIGS. 17 and 18.

The concave portion 23 disposed in the lid 12 of the vacuum vessel 4 also opens on a peripheral wall side of the lid 12. Each distribution tubular portion 21b of the rectangular waveguide 21 for the electromagnetic wave distribution communicates with each rectangular waveguide 22 for the electromagnetic wave radiation via the third electromagnetic wave transfer path 103c and the opening in the peripheral wall of the lid 12. It is to be noted that the dielectric component 31 disposed in the rectangular waveguide 22 for the electromagnetic wave radiation extends to an opening end of the peripheral wall of the lid 12.

Each third electromagnetic wave transfer path 103c has: a wedge-shaped dielectric component 42 formed integrally with a sealing component 41; a connection component 50; a first flange 51; a second flange 52; a third flange 53; a first O-ring 54; and a second O-ring 55.

The sealing component 41 and the wedge-shaped dielectric component 42 can be formed, for example, of dielectric materials such as quartz, alumina, and fluorocarbon resin. In the present embodiment, the sealing component 41 and the wedge-shaped dielectric component 42 are formed of quartz in the same manner as in the dielectric component 31 disposed in the second electromagnetic wave transmission path 103b.

As shown in FIG. 18, the wedge-shaped dielectric component 42 is formed into a wedge shape whose side face substantially has an isosceles triangular shape enlarging/opening toward the transmission side of the electromagnetic wave. A length $m_1$ of the wedge-shaped dielectric component 42 along the transmission direction is set to be longer than a wavelength of the electromagnetic wave generated by the high-frequency power supply 2 in vacuum. Therefore, as shown in FIG. 17, in the plasma treatment apparatus 101, a distance n between the end portion of a first electromagnetic wave transmission path 103a and an end portion of the second electromagnetic wave transmission path 103b on a side opposite to the transmission side is longer than the wavelength of the electromagnetic wave generated in the high-frequency power supply 2 in vacuum. As shown in FIG. 18, a length $m_2$ of a top side 42a of the wedge-shaped dielectric component 42 is set to be substantially equal to a length of a long side $x_2$ of an inner shape of the rectangular waveguide 22 for the electromagnetic wave radiation disposed in the second electromagnetic wave transmission path 103b.

Figure 17:
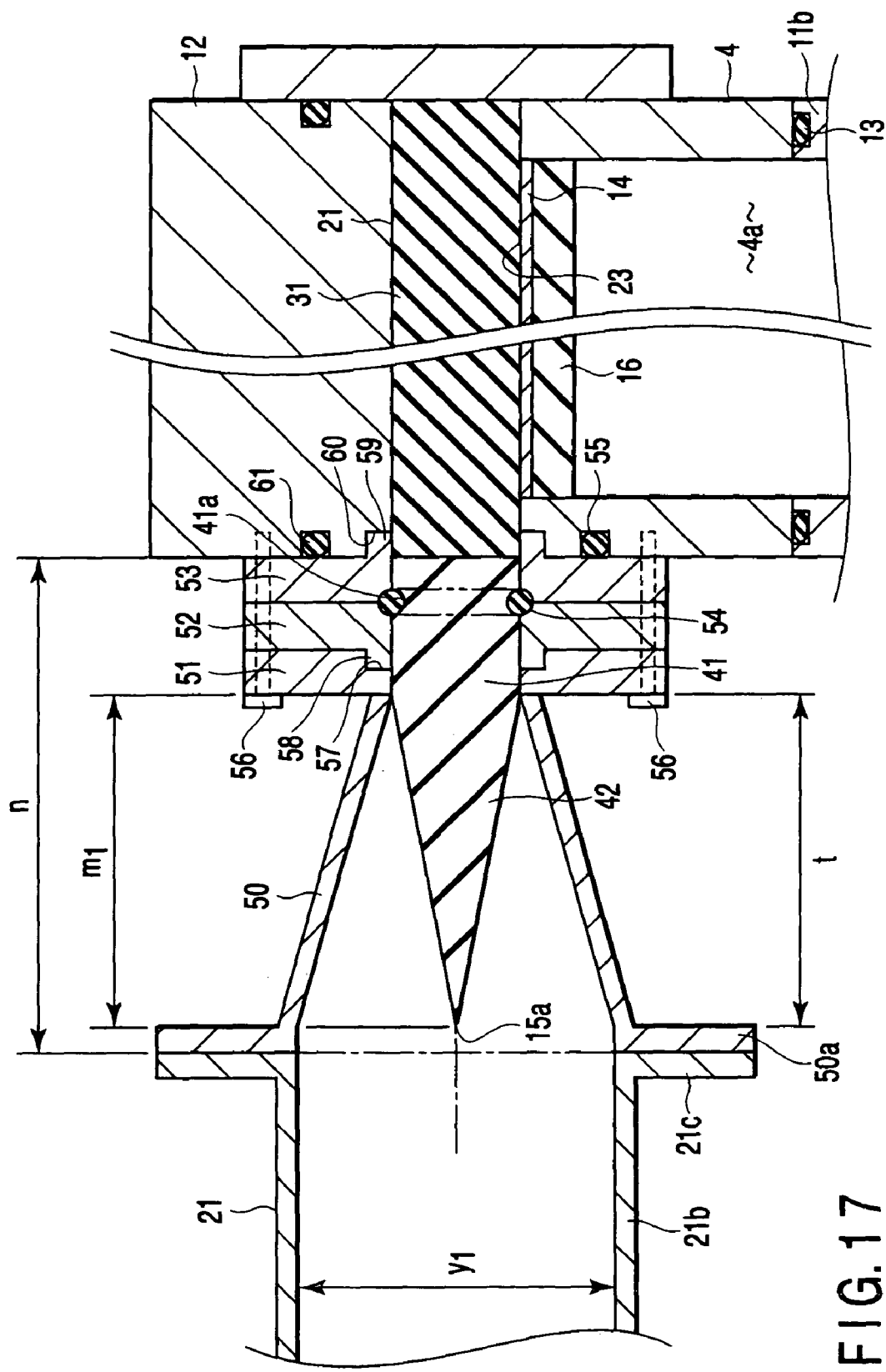
FIG. 17 is an enlarged sectional view in the vicinity of a third electromagnetic wave transfer path of the plasma treatment apparatus of FIG. 14.

As shown in FIGS. 17 and 18, the sealing component 41 having a square pole shape is disposed integrally with the end portion of the wedge-shaped dielectric component 42 on the transmission side. A groove 41a is formed in a peripheral direction in the sealing component 41. It is to be noted that the sealing component 41 may be formed integrally with the dielectric component 31 disposed in the second electromagnetic wave transmission path 103b (rectangular waveguide 22 for the electromagnetic wave radiation). Furthermore, the sealing component 41, the wedge-shaped dielectric component 42, and the dielectric component 31 in the second electromagnetic wave transmission path may be all integrally formed.

As the connection component 50, for example, a substantially conical tube having a taper whose inner dimension is reduced toward the transmission side of the electromagnetic wave is usable. The inner dimension of the end portion of the connection component 50 on the transmission side of the electromagnetic wave is formed to be substantially equal to a sectional dimension of the sealing component 41. A flange 50a is disposed in an end portion of the connection component 50 on a side opposite to the transmission side of the electromagnetic wave to face the flange 21c disposed on the tip portion of the distribution tubular portion 21b of the rectangular waveguide 21 for the electromagnetic wave distribution. When the flange 21c is fixed to the flange 50a, the rectangular waveguide 21 for the electromagnetic wave distribution is coupled to the connection component 50. As shown in FIG. 17, a length t of the connection component 50 along the transmission direction excluding the flange 50a is set to be substantially equal to the length $m_1$ of the wedge-shaped dielectric component 42 along the transmission direction.

The first to third flanges 51, 52, 53 have through holes each of which has a size substantially equal to the sectional dimension of the sealing component 41. In this third electromagnetic wave transfer path 103c, the connection component 50, first flange 51, second flange 52, and third flange 53 are arranged in parallel with one another in order from a first electromagnetic wave transmission path 103a side. The first flange 51 is formed integrally with the connection component 50. Moreover, an end face of the first flange 51 on the transmission side has a concave portion 57, and a convex portion 58 to be fitted with the concave portion 57 is formed on the end face of the second flange 52 on the side opposite to the transmission side. When the convex portion 58 is fitted with the concave portion 57, the second flange 52 is fixed (positioned) with respect to the first flange 51. Furthermore, a convex portion 59 is formed on the end face of the third flange 53 on the transmission side. Moreover, an outer face of the peripheral wall of the lid 12 has a concave portion 60 which fits with the convex portion 59. When the convex portion 59 is fitted in the concave portion 60, the third flange 53 is fixed (positioned) with respect to the lid 12. A portion in which the convex portion 59 is fitted with the concave portion 60 has an effect of preventing deterioration of the O ring by the plasma. Furthermore, the first flange 51, second flange 52, and third flange 53 are screwed/fixed to the lid 12 of the vacuum vessel 4 by screws 56 which are fixing components. In this case, the vacuum vessel 4 is coupled to the connection component 50 via the flanges 51 to 53. It is to be noted that the connection component 50 may be formed separately from the first flange 51.

In this third electromagnetic wave transfer path 103c, the sealing component 41 is disposed in the first to third flanges 51 to 53, and the wedge-shaped dielectric component 42 formed integrally with the sealing component 41 is disposed in the connection component 50. It is to be noted that the end portion of the sealing component 41 on the transmission side is brought into contact with the end portion of the dielectric component 31 disposed in the second electromagnetic wave transmission path 103b on the side opposite to the transmission side.

The wedge-shaped dielectric component 42 is disposed in such a manner that the top side 42a is positioned in the vicinity of the end portion of the rectangular waveguide 21 for the electromagnetic wave distribution (tip portion of the distribution tubular portion 21b on the transmission side). The wedge-shaped dielectric component 42 is disposed in the connection component 50 in such a manner that the top side 42a is substantially parallel to the length $x_2$ direction of the inner dimension of the rectangular waveguide 22 for the electromagnetic wave radiation disposed in the second electromagnetic wave transmission path 103b.

The sealing component 41 disposed in the first to third flanges 51 to 53 keeps the air tightness between the second and third flanges 52, 53 and the sealing component 41, when the first O-ring 54 disposed along the groove 41a is pressed onto inner wall faces of the second and third flanges 52, 53. In this case, the air tightness of the vacuum vessel 4 can be held.

It is to be noted that the connection component 50, first flange 51, second flange 52, and third flange 53 are formed of conductor materials. Therefore, when an interval between the electromagnetic wave transmission mechanism 103 (second and third flanges 52, 53) and the sealing component 41 exceeds 1 mm, there is possibility that abnormal discharge occurs between the electromagnetic wave transmission mechanism 103 and the sealing component 41. Therefore, the interval between the second and third flanges 52, 53 and the sealing component 41 is preferably set to 1 mm or less.

Moreover, when the inner shapes of the first to third flanges 51 to 53 are substantially matched with the inner shape (sectional shape) of the sealing component 41, the first to third flanges 51 to 53 can be filled with a seamless dielectric material (sealing component 41). That is, a rectangular waveguide containing the dielectric material is formed inside the first to third flanges 51 to 53, and reflection of the electromagnetic wave can be substantially zeroed in the waveguide. It is to be noted that the reflection caused between the second and third flanges 52, 53 and the groove of the first O-ring 54 can be suppressed, when the groove 41a is set to be shallow.

Furthermore, in the plasma treatment apparatus 101 of the present embodiment, an annular groove 61 is disposed in the outer face of the peripheral wall of the lid 12 facing the end face of the third flange 53, the second O-ring 55 is disposed in this groove 61, and accordingly the air tightness is kept between the third flange 53 of the third electromagnetic wave transfer path 103c and the lid 12 of the vacuum vessel 4.

A fifth embodiment is shown in FIG. 19. The sealing component 41 does not have to be a sealing component having a square pole shape, and may be a columnar sealing component 43. When the columnar sealing component 43 is used, a cylindrical waveguide may be used in the first to third flanges 51 to 53. The cylindrical waveguide can realize satisfactory sealing as compared with the rectangular waveguide, because the waveguide can be uniformly tightened by the screws 56 arranged in a concentric circle. In the connection component 50, a substantially conical tube having a taper whose inner dimension is reduced is used. In this case, circular waveguides are coupled to each other, matching of electromagnetic wave propagation does not collapse, reflection is reduced, and satisfactory electromagnetic wave propagation can be realized. The sealing component 43 has a wedge-shaped dielectric component 44 formed integrally with the sealing component 43. Moreover, the dielectric component 44 on the tip portion is formed into a wedge shape whose side face has a substantially isosceles triangular shape expanding/opening toward the electromagnetic wave transmission side of the wedge shape. FIG. 20 is a perspective view showing example of mode converters from circulator to rectangle wave guide.

Each rectangular waveguide 22 for the electromagnetic wave radiation is coupled to the high-frequency power supply 2 via the rectangular waveguide 21 for the electromagnetic wave distribution for distributing the electromagnetic wave to the rectangular waveguides 22. The high-frequency power supply 2 which supplies an electromagnetic wave, for example, having a frequency of 10 MHz to 25 GHz to the electromagnetic wave transmission mechanism 103 is usable. In the present embodiment, one microwave source which supplies an electromagnetic wave having a frequency of 2.45 GHz±50 MHz to the electromagnetic wave transmission mechanism 103 is adopted as the high-frequency power supply 2. The high-frequency power supply 2 whose frequency is 2.45 GHz is produced in mass. The supply is preferably inexpensive, and has a variety of types.

As described above, in this plasma treatment apparatus 101, the electromagnetic wave is supplied to a plurality of (three in the present embodiment) rectangular waveguides 22 for the electromagnetic wave radiation from one high-frequency power supply 2 via the rectangular waveguide 21 for the electromagnetic wave distribution. Thus, the electromagnetic wave projected into the rectangular waveguide 22 for the electromagnetic wave radiation is radiated into the vacuum vessel 4 from the slots 15a. It is to be noted that the electromagnetic wave left without being radiated is finally reflected by the third flange 53, and radiated into the vacuum vessel 4 through the slots 15a again when returning.

Therefore, since the frequency can be set to be equal in the whole region of the electromagnetic wave transmission mechanism 103, the electromagnetic wave radiation portion (slot plate 14) for radiating uniform energy density is easily designed.

Moreover, a cooling tube which is a cooling mechanism may be disposed in a region of the wall of the vacuum vessel 4 facing a portion between adjacent slots 15a. In this case, the electromagnetic wave transmission mechanism 103 (rectangular waveguides 22 for the electromagnetic wave radiation) can be controlled with good efficiency without inhibiting the generation of the plasma.

When the plasma treatment apparatus 101 is used, the component 5 to be treated can be plasma-oxidized, for example, under a surface wave plasma condition. When this plasma treatment apparatus 101 is used, for example, a film can be plasma-formed on the component 5 to be treated under the surface wave plasma condition. Furthermore, when this plasma treatment apparatus 101 is used, the component 5 to be treated can be plasma-etched under the surface wave plasma condition. When this plasma treatment apparatus 101 is used, plasma oxidation and film forming by a plasma CVD process can be plasma-etched continuously without breaking vacuum. A plasma treatment method for performing the plasma oxidation and the film forming by the plasma CVD process without breaking the vacuum will be described as one example of the plasma treatment method of the component 5 to be treated.

As the component 5 to be treated, for example, a silicon substrate is prepared. The component 5 to be treated is disposed on the support base 17 in the vacuum vessel 4. A vacuum exhaust system is operated, and air in the vacuum vessel 4 (treatment chamber 4a) is discharged. Thereafter, a first gas is supplied into the vacuum vessel 4 via the gas introduction port 18. As the first gas, for example, oxygen gas, or a mixture gas of oxygen with a rare gas containing at least one of helium, neon, argon, krypton, and xenon is used. In the present embodiment, the oxygen gas is adopted as the first gas, and this gas is supplied into the vacuum vessel 4 in such a manner that 400 SCCM of the oxygen gas is used, and a total pressure is 20 Pa.

When the gas pressure in the vacuum vessel 4 reaches a predetermined gas pressure, irradiation with the electromagnetic wave is started. The electromagnetic wave sent to the slots 15a via the electromagnetic wave transmission mechanism 103 is radiated into the vacuum vessel 4 via the respective slots 15a.

The electromagnetic wave radiated into the vacuum vessel 4 excites the oxygen gas which is the first gas. When electron density in the plasma in the vicinity of the dielectric component 16 for the covering increases to a certain degree, the electromagnetic wave cannot propagate in the plasma, and decays in the plasma. Therefore, any electromagnetic wave does not reach a region distant from the dielectric component 16 for the covering, and a surface wave plasma is generated in the vicinity of the dielectric component 16 for the covering.

In a state in which the surface wave plasma is generated, high electron density is achieved in the vicinity of the dielectric component 16 for the covering, and accordingly high-density oxygen atom active species are generated. The high-density oxygen atom active species diffuse to the component 5 to be treated, and efficiently oxidize the component 5 to be treated. Accordingly, a first insulating film is formed on the surface of the component 5 to be treated. It is to be noted that in a state in which the surface wave plasma is generated, electron temperature in the vicinity of the surface of the component 5 to be treated is low (electron energy is low), and therefore an electric field of a sheath in the vicinity of the surface of the component 5 to be treated is also weak. Therefore, since incidence energy of ions into the component 5 to be treated is reduced, ion damages on the component 5 to be treated during an oxidation process are suppressed.

Furthermore, a second gas is supplied into the vacuum vessel 4 from the gas introduction port 18. As the second gas, for example, a gas containing an organic silicon compound (tetra alkoxysilane, vinyl alkoxysilane, alkyl trialkoxysilane, phenyl trialkoxysilane, polymethyl disiloxane, polymethyl cyclotetrasiloxane, etc.) or an organic metal compound (trimethyl aluminum, triethyl aluminum, tetra propoxyzirconium, pentaethoxy tantalum, tetra propoxy hafnium, etc.) is usable. In the present embodiment, the oxygen gas is subsequently used as the first gas, and a tetra ethoxysilane gas which is one type of tetra alkoxysilane is used as the second gas. Moreover, these gases are supplied into the vacuum vessel 4 in such a manner that 400 SCCM of the oxygen gas is used as the first gas, 10 SCCM of the tetra ethoxysilane gas is used as the second gas, and a total pressure is 20 Pa.

An oxygen radical generated from the first gas reacts with tetra ethoxysilane which is the second gas. Accordingly, decomposition of tetra ethoxysilane is promoted, and silicon oxide is deposited on the surface of the component 5 to be treated. Accordingly, a second insulating film (silicon oxide film formed by CVD) is formed on a first insulating film. As described above, the forming of the insulating film on the component 5 to be treated is completed. According to the plasma treatment method, after subjecting the component 5 to be treated to an oxidation process, the film can be formed without being exposed to the atmosphere. Therefore, the interface between the component to be treated and the film can be formed into a satisfactory interface having little contamination, and a satisfactory-quality CVD film can be formed on the component 5 to be treated.

As described above, according to the plasma treatment apparatus 101 of the present embodiment, since the dielectric component 31 is disposed in the rectangular waveguide 22 for the electromagnetic wave radiation, the invasion of the plasma generated in the vacuum vessel 4 into the electromagnetic wave transmission mechanism 103 can be inhibited.

Additionally, the plasma treatment apparatus 101 of the present embodiment is constituted in such a manner that the electromagnetic wave (microwave) sent via the first electromagnetic wave transmission path 103a is sent to the second electromagnetic wave transmission path 103b without being reflected to the utmost. That is, the rectangular waveguide 21 for the electromagnetic wave distribution is coupled to the rectangular waveguide 22 for the electromagnetic wave radiation by the third electromagnetic wave transfer path 103c in a shape whose inner dimension is changed with respect to the transmission direction of the electromagnetic wave. A wedge-shaped dielectric component 52 is disposed in the connection component 50 disposed in the third electromagnetic wave transfer path 103c. Accordingly, the reflection of the electromagnetic wave by the sectional area change of the rectangular waveguide, and the reflection of the electromagnetic wave in the interface between the sealing component 41 formed of a dielectric material and the dielectric component 31 can be inhibited. Therefore, the electromagnetic wave can be radiated into the vacuum vessel 4 with good efficiency.

Moreover, according to the plasma treatment apparatus 101, the lid 12 which is the wall of the vacuum vessel 4 has the rectangular waveguide 22 for the electromagnetic wave radiation which is at least a part of the electromagnetic wave transmission mechanism 103 for transmitting the electromagnetic wave. Therefore, according to the plasma treatment apparatus 101, a structure can be simplified. A large-area uniform plasma can be generated in the vacuum vessel 4. Additionally, even the component 5 to be treated, for example, a square substrate or a large-area substrate, can be satisfactorily plasma-treated.

Moreover, according to the plasma treatment apparatus 101, the electromagnetic wave transmission window for applying the electromagnetic wave into the vacuum vessel 4 can be removed from the vacuum vessel 4. Additionally, sealing portions for holding vacuum of the vacuum vessel 4 may be a connection portion which connects the rectangular waveguide 21 for the electromagnetic wave distribution to the vacuum vessel 4, a connection portion which connects the lid 12 to the vessel main body 11 and the like. Therefore, the sealing portions can be reduced in the plasma treatment apparatus of the present embodiment as compared with a conventional plasma treatment apparatus.

Furthermore, according to the plasma treatment apparatus 101 of the present embodiment, the component 5 to be treated can be plasma-treated by the surface wave plasma having few ion damages.

The plasma treatment apparatus and the plasma treatment method of the present invention are not limited to the above-described embodiments, and can be variously carried out without departing from the scope.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A surface-wave plasma treatment apparatus comprising: a high-frequency power supply that outputs an electromagnetic wave; a first rectangular waveguide for electromagnetic wave distribution, which is connected to the high-frequency power supply and filled with air; a plurality of second rectangular parallelepiped waveguides for electromagnetic wave radiation, which are arranged in parallel with each other and connected to the first rectangular waveguide for electromagnetic wave distribution in a direction in which the second rectangular parallelepiped waveguides for electromagnetic wave radiation turn an electromagnetic wave transmitted in the first rectangular waveguide for electromagnetic wave distribution at a right angle; a plurality of slit-shaped slots formed in each of the plurality of second rectangular parallelepiped waveguides for electromagnetic wave radiation to allow the electromagnetic wave to be radiated, the direction of the largest dimension of the slit-shaped slots of each of the slit-shaped slots being in parallel extending in a longitudinal direction of the second rectangular parallelepiped waveguides; a first dielectric component formed in a plate shape to cover the plurality of slots, the first dielectric component having a thickness smaller than ¼ of a wavelength of an electromagnetic wave in the first dielectric component to prevent the electromagnetic wave from propagating in a thickness direction; a treatment vessel, the first dielectric component provided between the plurality of slots and the treatment vessel, the treatment vessel provided in such a manner that the electromagnetic wave radiated from the plurality of slots and introduced into the treatment vessel through the first dielectric component generates a surface wave plasma at an area adjacent to or contiguous with an inner surface of the first dielectric component; and a second dielectric component provided to completely fill a connection portion between the first rectangular waveguide for electromagnetic wave distribution and each of the second rectangular parallelepiped waveguides for electromagnetic wave radiation to keep the second rectangular parallelepiped waveguides for electromagnetic wave radiation at a vacuum, wherein the treatment vessel includes a vessel main body and a lid, and an air-tightness maintaining member capable of decompressing and bringing an inside of the treatment vessel into a vacuum state or a vicinity of the vacuum state is provided at a connection portion between the vessel main body and the lid.

2. The plasma treatment apparatus according to claim 1, wherein the second dielectric component is formed of at least one of quartz, alumina, fluorocarbon resin, or a porous material.

3. The plasma treatment apparatus according to claim 1, further comprising: an electromagnetic wave source that supplies an electromagnetic wave having a frequency of 10 MHz to 25 GHz to the first rectangular waveguide for electromagnetic wave distribution.

4. The plasma treatment apparatus according to claim 3, wherein the electromagnetic wave source supplies an electromagnetic wave having a frequency of 2.45 GHz±50 MHz to the first rectangular waveguide for electromagnetic wave distribution.

5. The plasma treatment apparatus according to claim 1, wherein a diameter of a cross section of each of the second rectangular parallelepiped waveguides for electromagnetic wave radiation is set to be smaller than that of the first rectangular waveguide for electromagnetic wave distribution, and an electromagnetic wave transmission path is connected to the connection portion, and has an inner diameter which gradually decreases in a transmission direction of the electromagnetic wave.

6. The plasma treatment apparatus according to claim 1, wherein a diameter of a cross section of each of the second rectangular parallelepiped waveguides for electromagnetic wave radiation is equal to that of the first rectangular waveguide for electromagnetic wave distribution.

7. The plasma treatment apparatus according to claim 1, wherein the second dielectric component is a dielectric material, and is formed in a shape of a wedge that is a substantially isosceles triangle in which a distance between substantially equal sides of the triangle increases in a transmission direction of the electromagnetic wave.

8. The plasma treatment apparatus according to claim 1, wherein each of the second rectangular parallelepiped waveguides for electromagnetic wave radiation is located in a position where amplitude of a standing wave is substantially maximum.

9. The plasma treatment apparatus according to claim 1, further comprising:
a fixing component provided to fix the first dielectric component;
a dielectric cap provided on the first dielectric component including the fixing component.

10. The plasma treatment apparatus according to claim 1, further comprising tapered connection waveguides between the first rectangular waveguide and the plurality of second rectangular parallelepiped waveguides.

11. The plasma treatment apparatus according to claim 1, wherein in the treatment vessel high-frequency power is not generated in a vicinity of a substrate to be processed.

\* \* \* \* \*